US009276080B2

(12) United States Patent
Sridharamurthy et al.

(10) Patent No.: US 9,276,080 B2
(45) Date of Patent: Mar. 1, 2016

(54) METHODS AND STRUCTURES OF INTEGRATED MEMS-CMOS DEVICES

(71) Applicant: MCube, Inc., San Jose, CA (US)

(72) Inventors: Sudheer S. Sridharamurthy, Menlo Park, CA (US); Te-Hse Terrence Lee, San Jose, CA (US); Ali J. Rastegar, Palo Alto, CA (US); Mugurel Stancu, San Jose, CA (US); Xiao Charles Yang, Cupertino, CA (US)

(73) Assignee: mCube, Inc., San Jose, CA (US)

( * ) Notice: Subject to any disclaimer, the term of this patent is extended or adjusted under 35 U.S.C. 154(b) by 0 days.

(21) Appl. No.: 13/788,503

(22) Filed: Mar. 7, 2013

(65) Prior Publication Data

US 2013/0236988 A1 Sep. 12, 2013

Related U.S. Application Data

(60) Provisional application No. 61/609,248, filed on Mar. 9, 2012, provisional application No. 61/745,496, filed on Dec. 21, 2012.

(51) Int. Cl.
*H01L 29/66* (2006.01)
*H01L 27/06* (2006.01)
(Continued)

(52) U.S. Cl.
CPC ........ *H01L 29/66007* (2013.01); *B81B 3/0013* (2013.01); *B81B 3/0086* (2013.01); *B81C 1/00238* (2013.01); *B81C 1/00801* (2013.01); *H01L 27/0688* (2013.01); *B81B 2203/0163* (2013.01); *B81C 2201/0132* (2013.01)

(58) Field of Classification Search
None
See application file for complete search history.

(56) References Cited

U.S. PATENT DOCUMENTS 5,736,732 A * 4/1998 Possin et al. ................ 250/208.1
5,825,385 A * 10/1998 Silverbrook .................. 347/56
(Continued)

FOREIGN PATENT DOCUMENTS

CN 102854998 A 1/2013
TW 201020548 A 6/2010
(Continued)

OTHER PUBLICATIONS

Office Action issued by the Taiwan Patent Office for patent application TW102108387 (Feb. 17, 2015).
(Continued)

*Primary Examiner* — Charles Garber
*Assistant Examiner* — Brigitte Paterson
(74) *Attorney, Agent, or Firm* — Kilpatrick Townsend & Stockton LLP

(57) ABSTRACT

A method for fabricating an integrated MEMS-CMOS device uses a micro-fabrication process that realizes moving mechanical structures (MEMS) on top of a conventional CMOS structure by bonding a mechanical structural wafer on top of the CMOS and etching the mechanical layer using plasma etching processes, such as Deep Reactive Ion Etching (DRIE). During etching of the mechanical layer, CMOS devices that are directly connected to the mechanical layer are exposed to plasma. This sometimes causes permanent damage to CMOS circuits and is termed Plasma Induced Damage (PID). Embodiments of the present invention presents methods and structures to prevent or reduce this PID and protect the underlying CMOS circuits by grounding and providing an alternate path for the CMOS circuits until the MEMS layer is completely etched.

18 Claims, 28 Drawing Sheets

(51) Int. Cl.
    *B81B 3/00*      (2006.01)
    *B81C 1/00*      (2006.01)

(56) References Cited

U.S. PATENT DOCUMENTS

| | | | |
|---|---|---|---|
| 7,595,209 | B1* | 9/2009 | Monadgemi et al. ............ 438/51 |
| 8,164,171 | B2 | 4/2012 | Lin et al. |
| 8,205,498 | B2 | 6/2012 | Hsu et al. |
| 8,516,886 | B2 | 8/2013 | Acar et al. |
| 8,878,312 | B2 | 11/2014 | Hung et al. |
| 2003/0196490 | A1 | 10/2003 | Cardarelli |
| 2009/0309203 | A1 | 12/2009 | Seppala et al. |
| 2010/0071467 | A1 | 3/2010 | Nasiri et al. |
| 2011/0030473 | A1 | 2/2011 | Acar |
| 2011/0031565 | A1 | 2/2011 | Marx et al. |
| 2011/0121416 | A1 | 5/2011 | Quevy et al. |
| 2012/0012970 | A1 | 1/2012 | Xu et al. |
| 2012/0223726 | A1 | 9/2012 | Zhang et al. |
| 2012/0248615 | A1* | 10/2012 | Chien et al. .................... 257/770 |
| 2013/0042686 | A1 | 2/2013 | Lin et al. |
| 2013/0082338 | A1* | 4/2013 | Pan et al. ...................... 257/415 |
| 2013/0247662 | A1 | 9/2013 | Jin et al. |
| 2013/0247666 | A1 | 9/2013 | Acar |
| 2013/0328139 | A1 | 12/2013 | Acar |

FOREIGN PATENT DOCUMENTS

| | | |
|---|---|---|
| TW | 201110274 A | 3/2011 |
| TW | 201117349 A | 5/2011 |
| TW | 201213764 A | 4/2012 |
| TW | 201229516 A | 7/2012 |
| TW | 201238032 A | 9/2012 |
| WO | WO2010092399 A2 | 8/2010 |

OTHER PUBLICATIONS

China Intellectual Property Office office action for application CN201310076476.9 dated Apr. 15, 2015.
Taiwan Patent Office Office Action for patent application TW103103001 (Aug. 6, 2015).
Taiwan Patent Office Office Action for patent application TW103103000 (May 11, 2015).
Search Report for European patent application EP14171673.8 (Nov. 10, 2014), 8 pages.
Search Report and Written Opinion for European patent application EP14152747 (Sep. 3, 2014), 11 pages.
Sun Sensing and control electronics design for capacitive CMOS-MEMS inertial sensors, PhD. Dissertation University of Florida (copyright 2002), sections 2.2.4, 7.3, chapters 3 and 6.
Tatar et al. "Quadrature-Error Compensation and Corresponding Effects on the Performance of Fully Decoupled MEMS Gyroscopes," Journal of Microelectromechanical Systems, vol. 21, pp. 656-667 (Jun. 2012).
Xie "Gyroscope and Micromirror Design Using Vertical Axis CMOS-MEMS Actuation and Sensing," PhD. Dissertation Carnegie Institute of Technology (copyright 2002), sections 3.2, 5.3.2.2, 6.2.8, chapter 6.

* cited by examiner

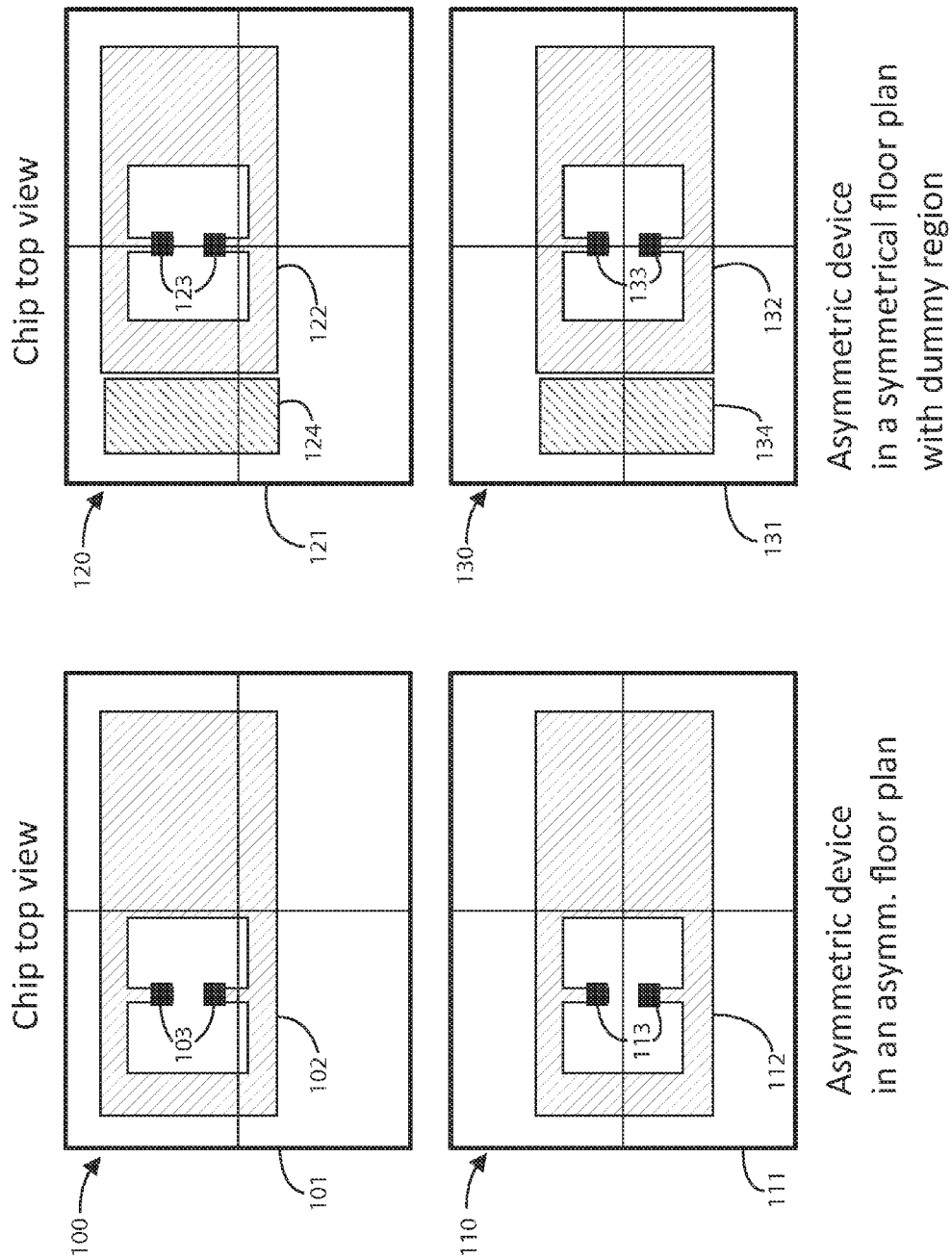

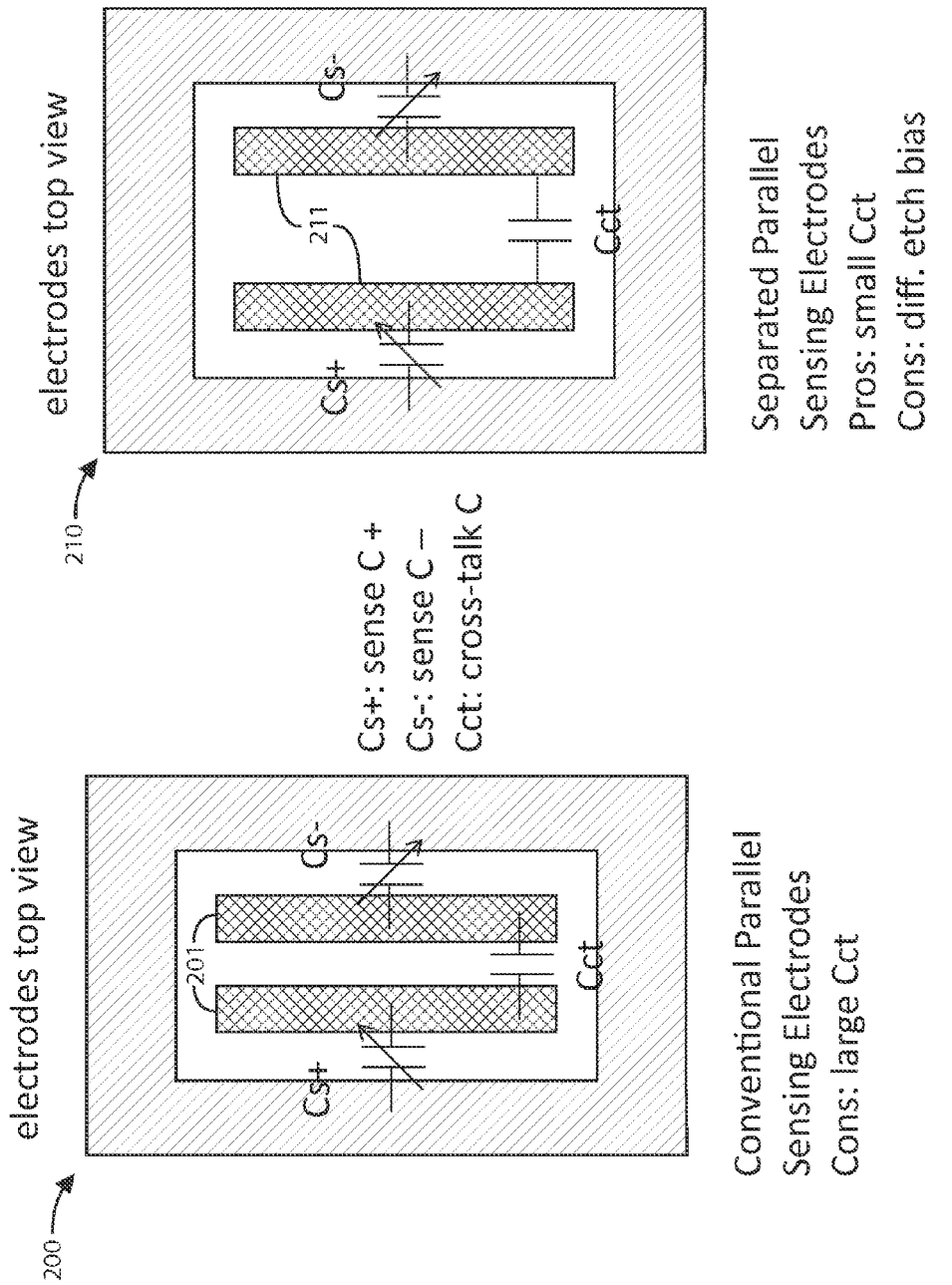

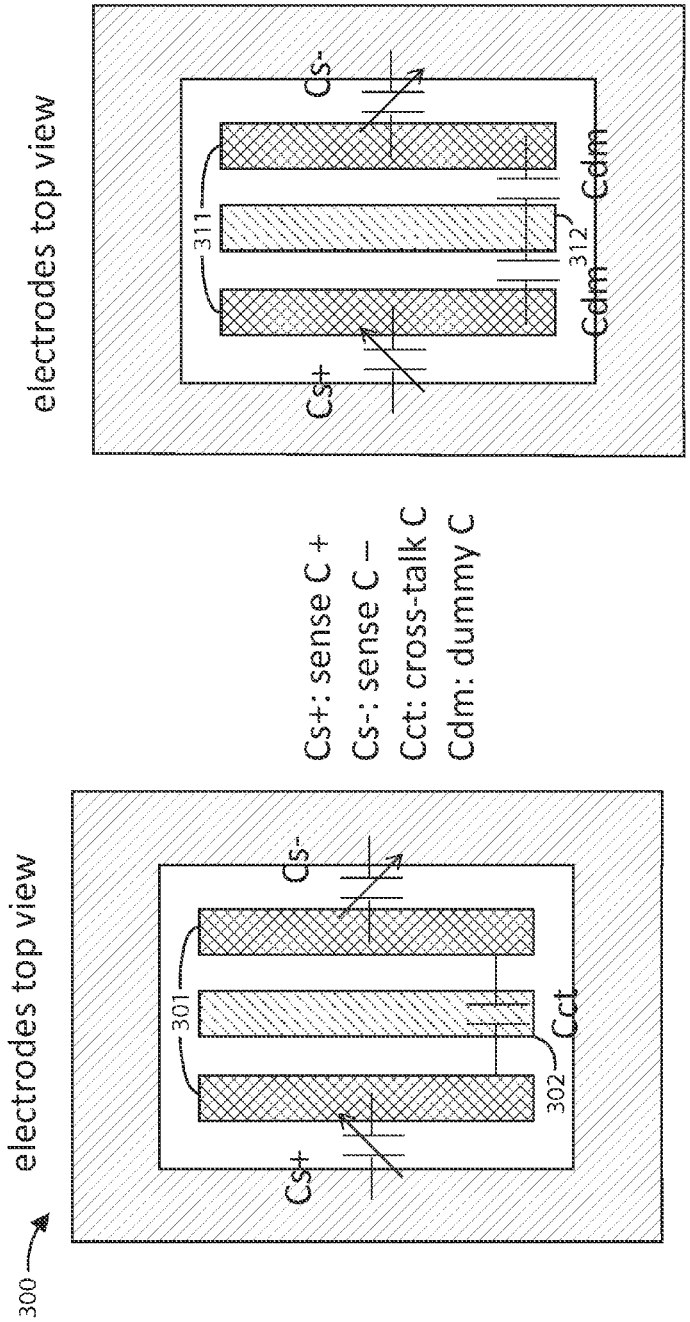

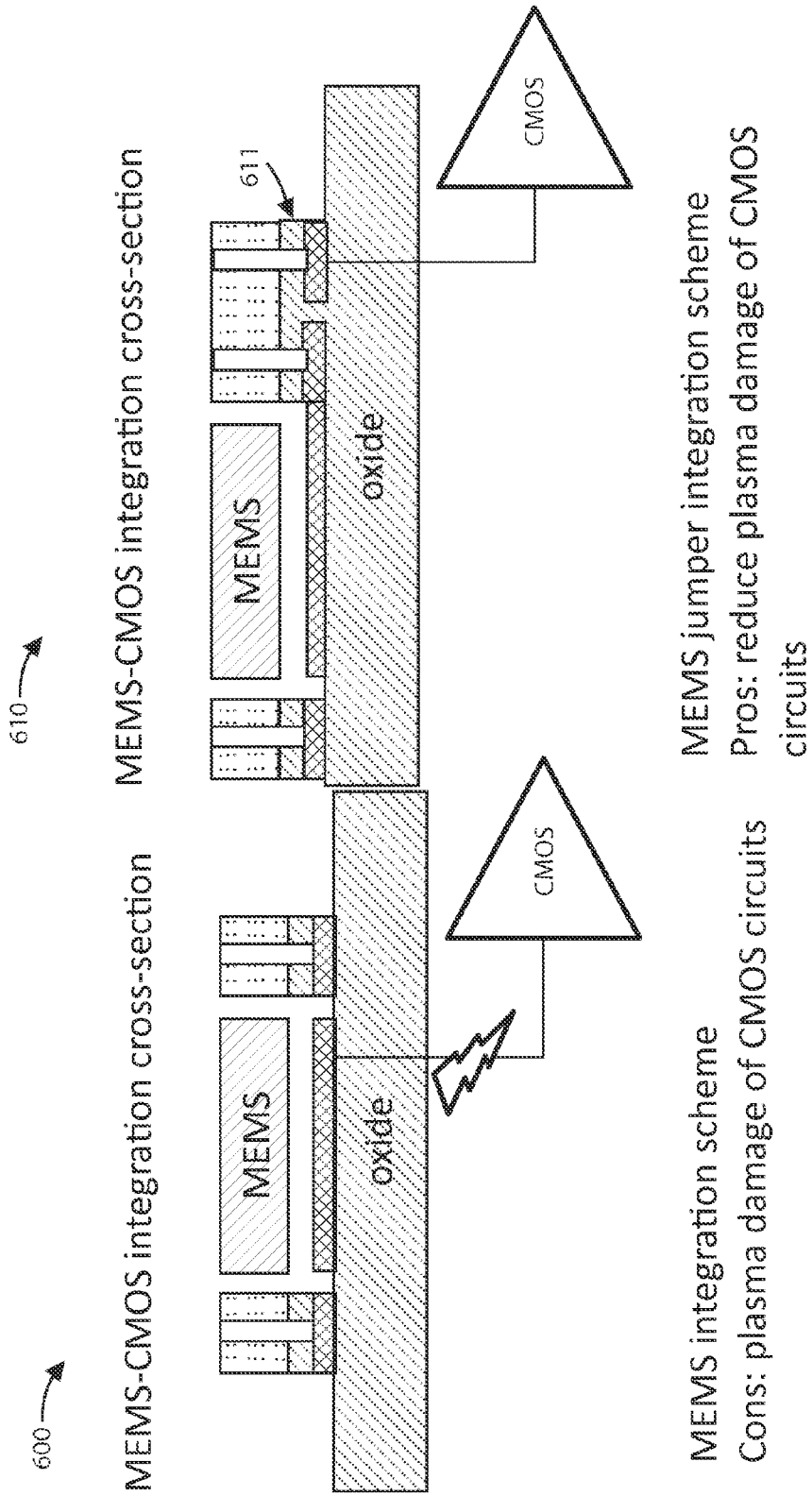

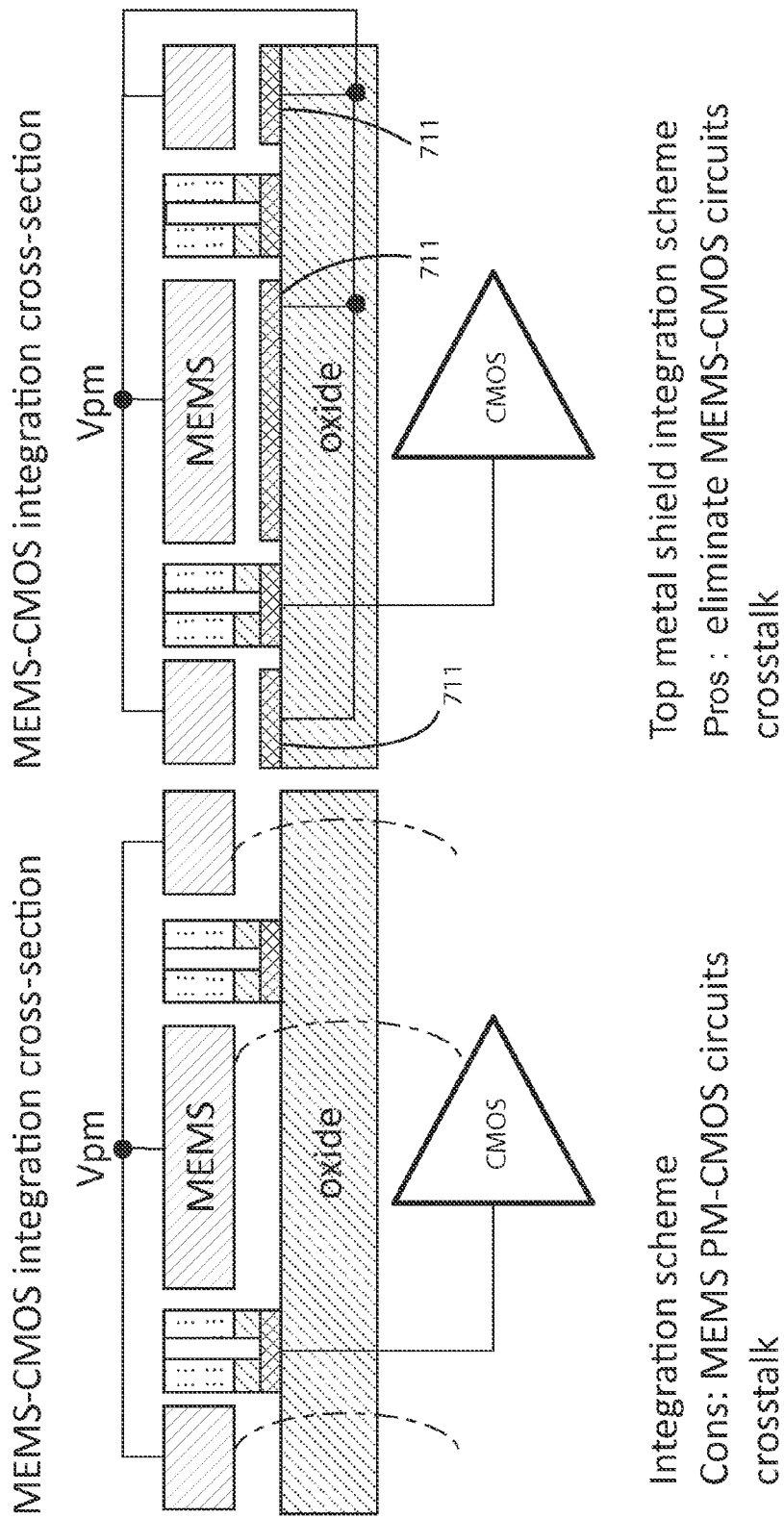

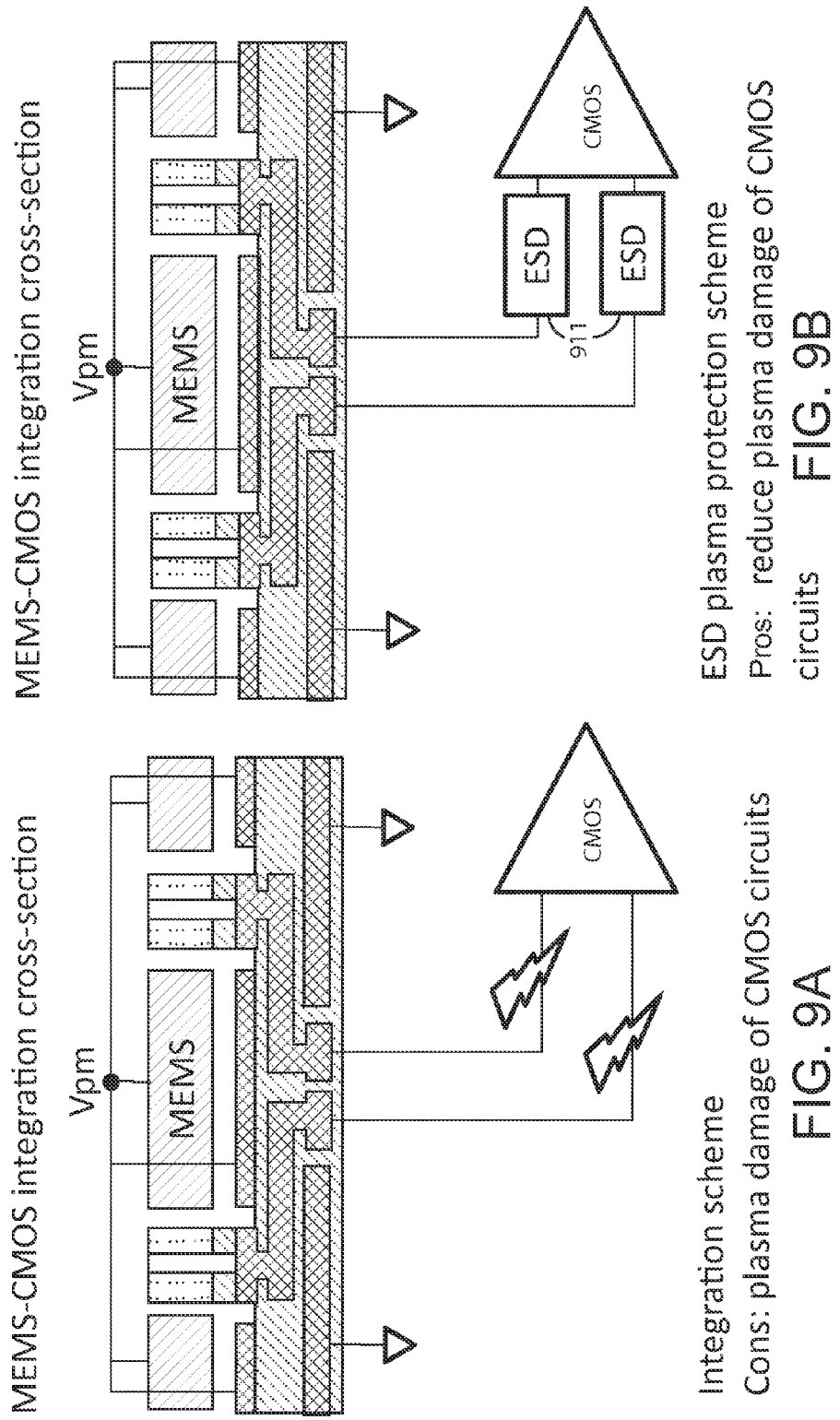

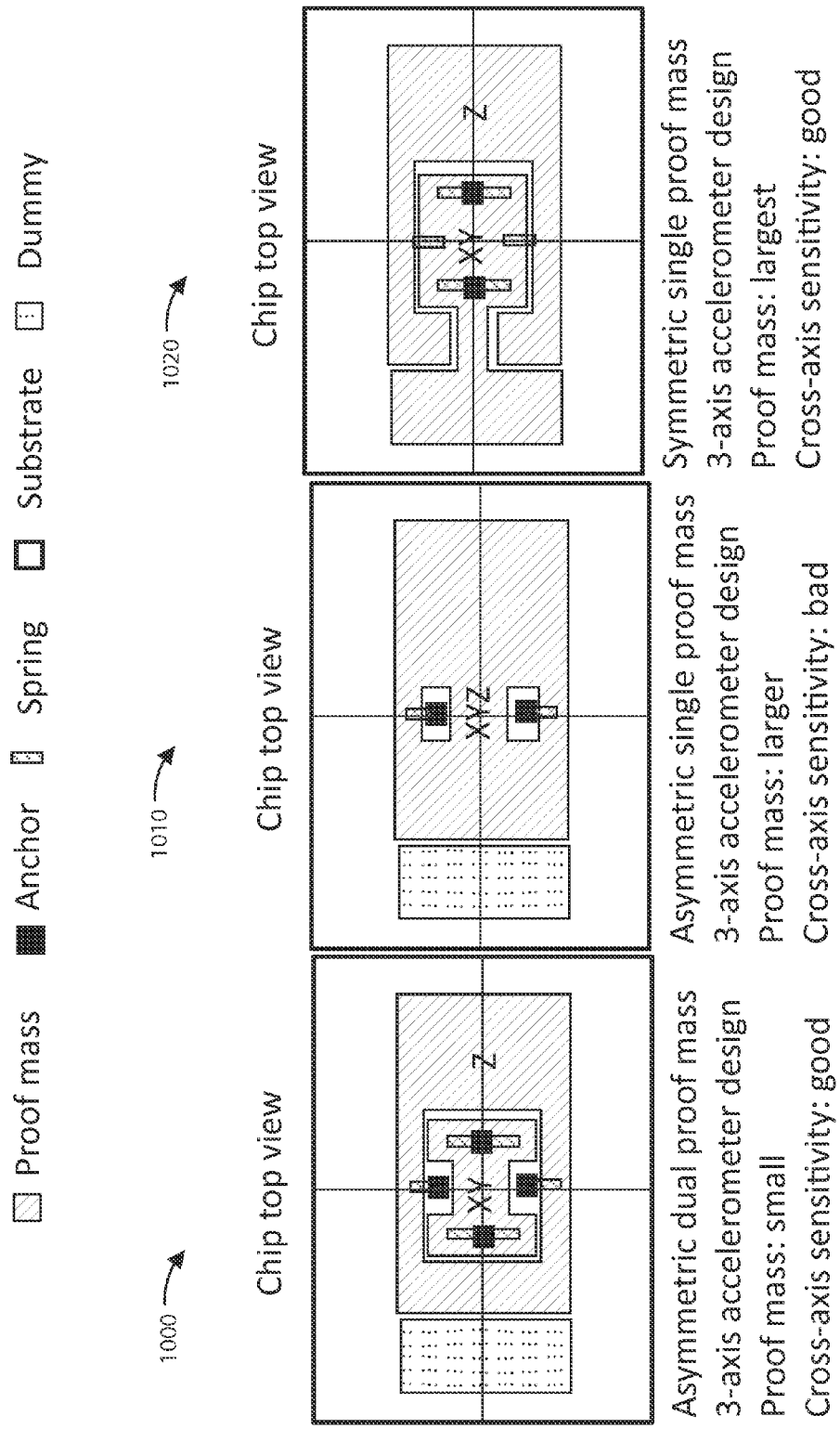

☐ Proof mass  ■ Anchor  ☐ Spring  ☐ Substrate  ☒ Dummy

Chip top view

Chip side view

Asymmetric dual proof mass
3-axis accelerometer design
Substrate stiffness: asymmetric Chip top view Chip side view Asymmetric dual proof mass
3-axis accelerometer design
Substrate stiffness: Symmetric

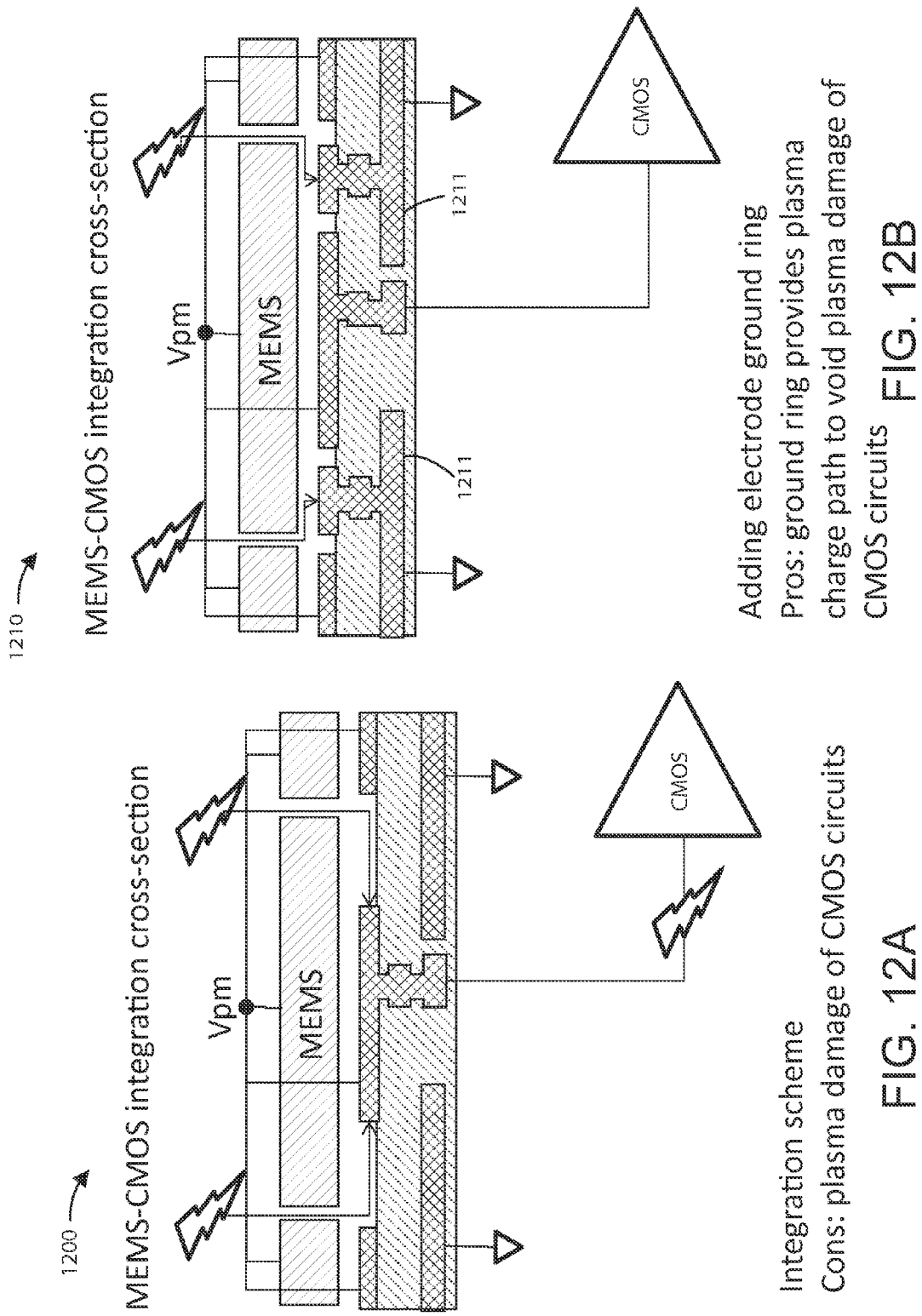

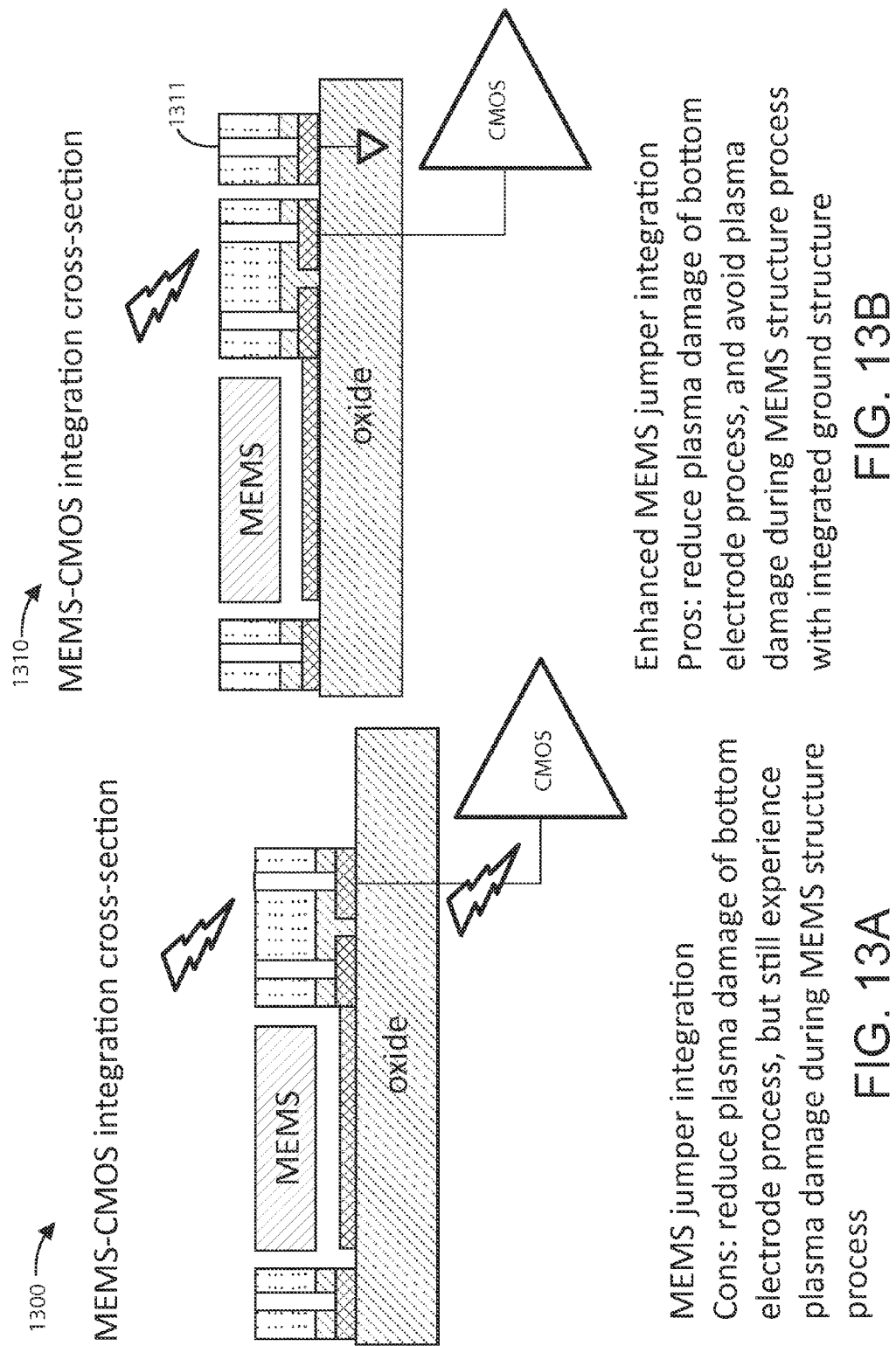

☐ Proof mass ■ Anchor ▨ Spring ☐ Substrate ▨ Stop ▥ Dummy

Asymmetric dual proof mass 3-axis accelerometer design with stops

Asymmetric dual proof mass 3-axis accelerometer design with recess stops, less Z-axis stiction risk

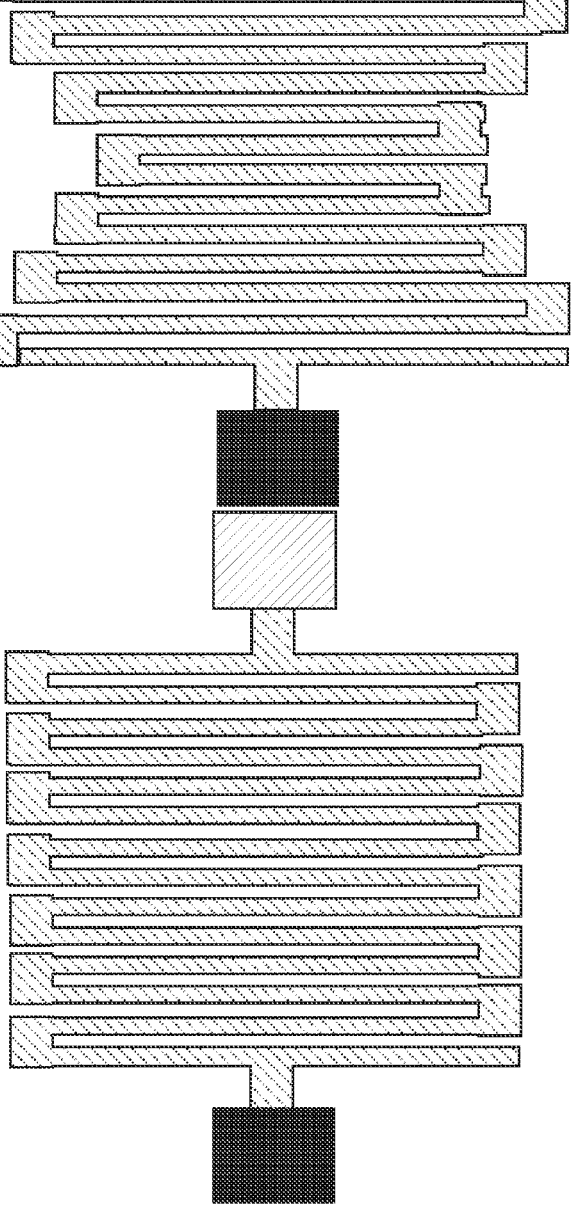

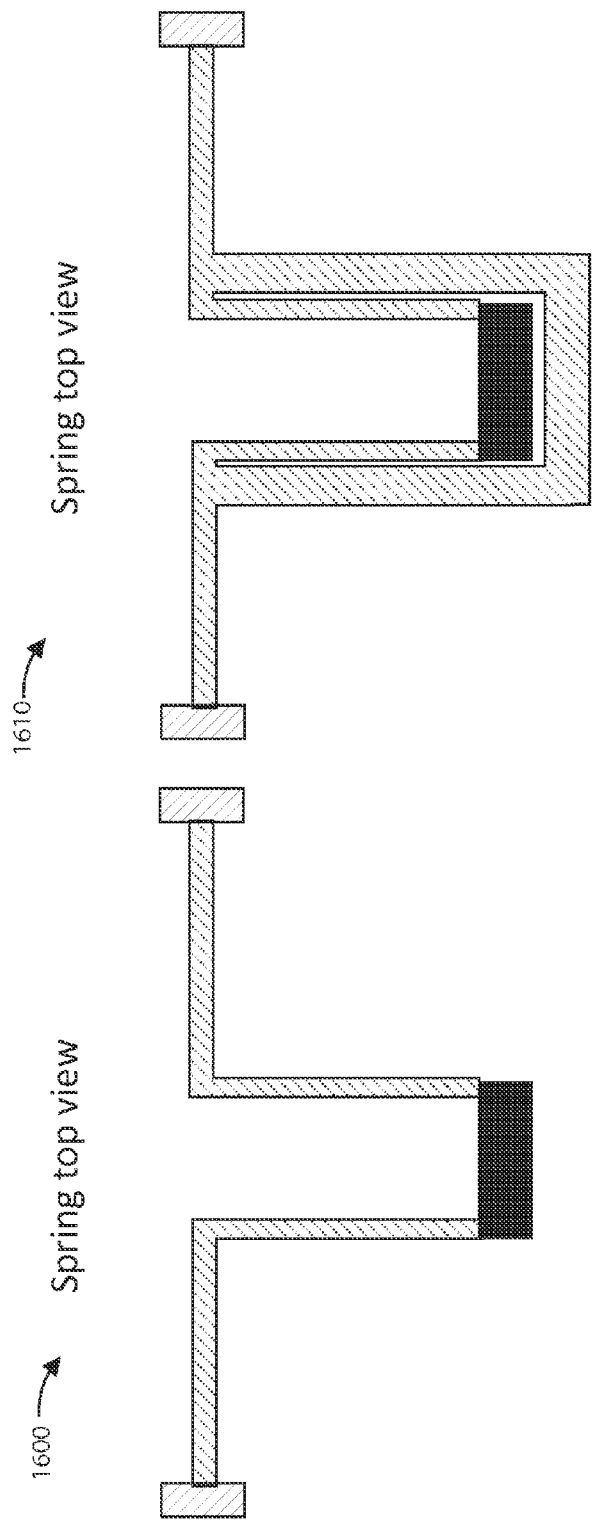

Chip top view

Chip side view

Electrode design
Cons: larger offset from substrate deformation

Chip top view

Chip side view

Square Electrode design
Pros: smaller offset from substrate deformation

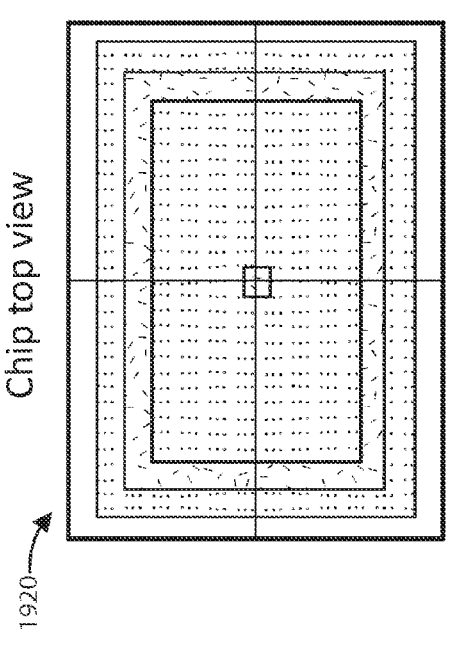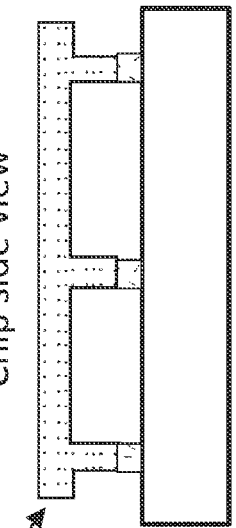
FIG. 19C Chip top view
FIG. 19D Chip side view
Enhanced Cap scheme
Pros: reduce grind fracture risk for thin substrate/Cap process
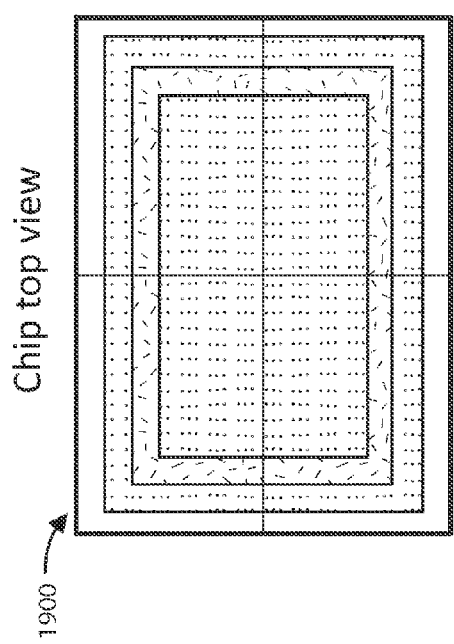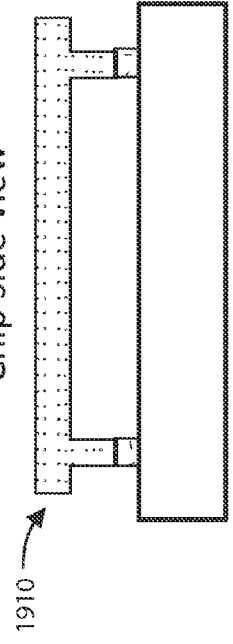
FIG. 19A Chip top view
FIG. 19B Chip side view
Cap scheme
Cons: grind fracture risk for thin substrate/Cap process ☐ Proof mass ■ Anchor ☐ Spring ☐ Substrate ☐ Cap ☐ Bond ▦ Circuits Chip top view Chip top view Original Integration scheme
Cons: circuit failure risk under
Bond region with high stress Enhanced Integration scheme
Pros: reduce circuit failure risk under
Bond region with high stress

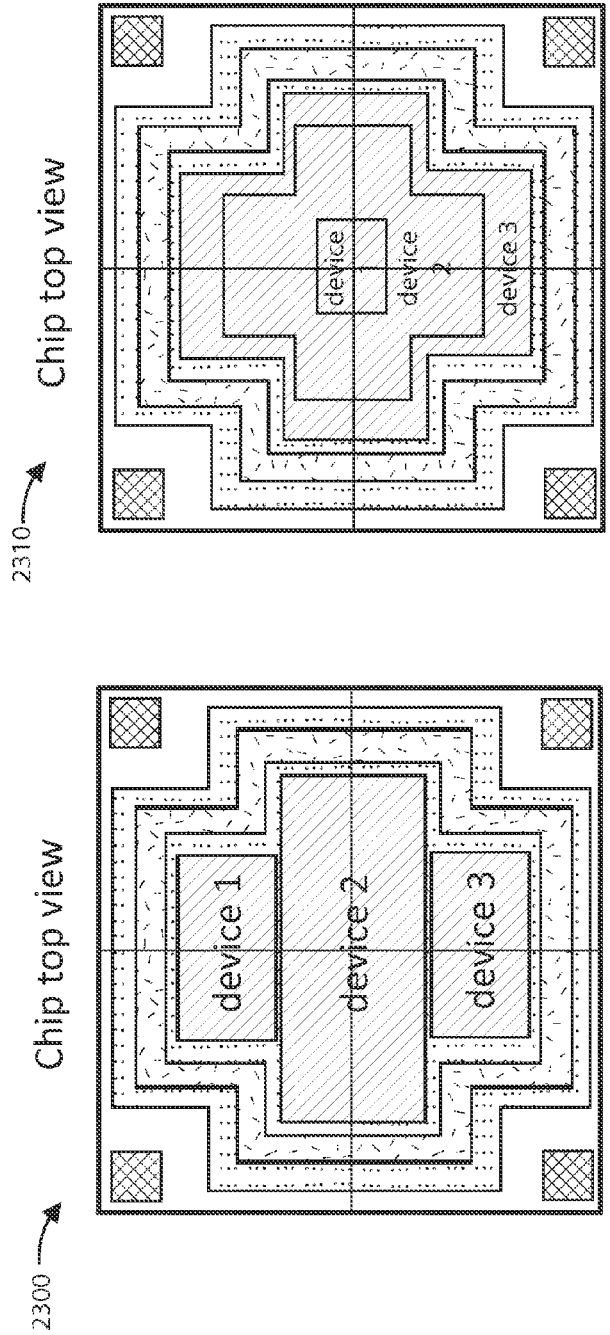
FIG. 23A — Device Integration. Cons: Asymmetric/offset device center
FIG. 23B — Concentric device integration. Pros: Symmetric/offset device center

METHODS AND STRUCTURES OF INTEGRATED MEMS-CMOS DEVICES

CROSS-REFERENCES TO RELATED APPLICATIONS

The present application claims priority to and incorporates by reference, for all purposes, the following patent applications: U.S. Prov. App. No. 61/609,248, filed Mar. 9, 2012, U.S. Prov. App. No. 61/745,496, filed Dec. 21, 2012.

BACKGROUND OF THE INVENTION

The present invention is directed to MEMS (Micro-Electro-Mechanical-Systems). More specifically, embodiments of the invention provide methods and structure for improving integrated MEMS devices, including inertial sensors and the like. Merely by way of example, the MEMS device can include at least an accelerometer, a gyroscope, a magnetic sensor, a pressure sensor, a microphone, a humidity sensor, a temperature sensor, a chemical sensor, a biosensor, an inertial sensor, and others. But it will be recognized that the invention has a much broader range of applicability.

Research and development in integrated microelectronics have continued to produce astounding progress in CMOS and MEMS. CMOS technology has become the predominant fabrication technology for integrated circuits (IC). MEMS, however, continues to rely upon conventional process technologies. In layman's terms, microelectronic ICs are the "brains" of an integrated device which provides decision-making capabilities, whereas MEMS are the "eyes" and "arms" that provide the ability to sense and control the environment. Some examples of the widespread application of these technologies are the switches in radio frequency (RF) antenna systems, such as those in the iPhone™ device by Apple, Inc. of Cupertino, Calif., and the Blackberry™ phone by Research In Motion Limited of Waterloo, Ontario, Canada, and accelerometers in sensor-equipped game devices, such as those in the Wii™ controller manufactured by Nintendo Company Limited of Japan. Though they are not always easily identifiable, these technologies are becoming ever more prevalent in society every day.

Beyond consumer electronics, use of IC and MEMS has limitless applications through modular measurement devices such as accelerometers, gyroscopes, actuators, and sensors. In conventional vehicles, accelerometers and gyroscopes are used to deploy airbags and trigger dynamic stability control functions, respectively. MEMS gyroscopes can also be used for image stabilization systems in video and still cameras, and automatic steering systems in airplanes and torpedoes. Biological MEMS (Bio-MEMS) implement biosensors and chemical sensors for Lab-On-Chip applications, which integrate one or more laboratory functions on a single millimeter-sized chip only. Other applications include Internet and telephone networks, security and financial applications, and health care and medical systems. As described previously, ICs and MEMS can be used to practically engage in various type of environmental interaction.

Although highly successful, ICs and in particular MEMS still have limitations. Similar to IC development, MEMS development, which focuses on increasing performance, reducing size, and decreasing cost, continues to be challenging. Additionally, applications of MEMS often require increasingly complex microsystems that desire greater computational power. Unfortunately, such applications generally do not exist. These and other limitations of conventional MEMS and ICs may be further described throughout the present specification and more particularly below.

From the above, it is seen that techniques for improving operation of integrated circuit devices and MEMS are highly desired.

BRIEF SUMMARY OF THE INVENTION

The present invention is directed to MEMS (Micro-Electro-Mechanical-Systems). More specifically, embodiments of the invention provide methods and structure for improving integrated MEMS devices, including inertial sensors and the like. Merely by way of example, the MEMS device can include at least an accelerometer, a gyroscope, a gyrometer, a magnetic field sensor, a pressure sensor, a microphone, a humidity sensor, a temperature sensor, a chemical sensor, a biosensor, an inertial sensor, and others. But it will be recognized that the invention has a much broader range of applicability.

The present invention includes a method and structure for an integrated MEMS-CMOS device. The structure can include a 3-axis inertial sensing device. In various embodiments, the 3-axis inertial sensing device includes single proof mass and dual proof mass configurations. A dummy region and symmetric electrodes can be used to reduce differential bias due to asymmetric substrate stresses. Metal structures, via structures, and grounding structures can be used to reduce the risk of plasma damage during an etching process. Stop structures and staggered serpentine spring structures can be used to reduce stiction of MEMS components. Jointed spring structures can include U-shaped members to reduce spring rotation. The method of fabrication forming the described features can reduce risk of deformation and device failures during processes such as MEMS etching, cap bonding, and the like.

In an embodiment, the present method uses a micro-fabrication process that realizes moving mechanical structures (MEMS) on top of a conventional CMOS structure by bonding a mechanical structural wafer on top of the CMOS and etching the mechanical layer using plasma etching processes, such as Deep Reactive Ion Etching (DRIE). During etching of the mechanical layer, CMOS devices that are directly connected to the mechanical layer are exposed to plasma. This sometimes causes permanent damage to CMOS circuits and is termed Plasma Induced Damage (PID). Embodiments of the present invention presents methods and structures to prevent or reduce this PID and protect the underlying CMOS circuits by grounding and providing an alternate path for the CMOS circuits until the MEMS layer is completely etched.

In an embodiment, the present invention provides a method of fabricating an integrated MEMS-CMOS device. The method can include providing a substrate having a surface region, forming a CMOS IC layer with at least one CMOS electrode overlying the surface region, forming a mechanical structural layer overlying the CMOS IC layer, forming one or more MEMS devices overlying the CMOS IC layer from a first portion of the mechanical structural layer, forming a protection structure coupled to the at least one CMOS electrode, and forming one or more MEMS devices coupled to the protection structure overlying the CMOS IC layer from a second portion of the mechanical structural layer. The protection structure can include one or more ground posts, a jumper, and an ESD diode. The resulting integrated MEMS-CMOS device includes an integrated device with a MEMS layer overlying a CMOS IC layer overlying a substrate, in which a protection structure is integrated in the MEMS layer and coupled to both the MEMS layer and the CMOS IC layer.

Many benefits are achieved by way of embodiments of the present invention over conventional techniques. For example, embodiments of the present technique provide an easy to use process to integrated MEMS and CMOS circuits on a single die. In some embodiments, the method provides a fabrication process that protects exposed CMOS ICs from PID. Additionally, the method provides a process and system that are compatible with conventional semiconductor and MEMS process technologies without substantial modifications to conventional equipment and processes. Depending upon the embodiment, one or more of these benefits may be achieved. These and other benefits will be described in more detail throughout the present specification and more particularly below.

Various additional features and advantages of the present invention can be more fully appreciated with reference to the detailed description and accompanying drawings that follow.

BRIEF DESCRIPTION OF THE DRAWINGS

FIG. 1A is a simplified diagram illustrating a top view of an integrated circuit chip that includes an asymmetric device in an asymmetric floor place;

FIG. 1B is a simplified diagram illustrating a top view of an integrated circuit chip that includes an asymmetric device in a symmetric floor plan which includes dummy design according to an embodiment of the present invention;

FIG. 2A is a simplified diagram illustrating a top view of an arrangement of parallel sensing electrodes according to an embodiment of the present invention;

FIG. 2B is a simplified diagram illustrating a top view of separated parallel sensing electrodes according to an embodiment of the present invention;

FIG. 3A is a simplified diagram illustrating a top view of parallel sensing electrodes with floating dummy fill according to an embodiment of the present invention;

FIG. 3B is a simplified diagram illustrating a top view of parallel sensing electrodes with non-floating dummy fill according to an embodiment of the present invention;

FIG. 6A is a simplified diagram illustrating a cross-sectional view of an integrated MEMS-CMOS according to an embodiment of the present invention;

FIG. 6B is a simplified diagram illustrating a cross-sectional view of an integrated MEMS-CMOS according to an embodiment of the present invention;

FIG. 7A is a simplified diagram illustrating a cross-sectional view of a conventional integrated MEMS-CMOS;

FIG. 7B is a simplified diagram illustrating a cross-sectional view of an integrated MEMS-CMOS according to an embodiment of the present invention;

FIG. 9A is a simplified diagram illustrating a cross-sectional view of an integrated MEMS-CMOS according to an embodiment of the present invention;

FIG. 9B is a simplified diagram illustrating a cross-sectional view of an integrated MEMS-CMOS including ESD structures according to an embodiment of the present invention;

FIG. 10A is a simplified diagram illustrating a top view of an integrated MEMS-CMOS according to an embodiment of the present invention;

FIG. 10B is a simplified diagram illustrating a top view of an integrated MEMS-CMOS according to an embodiment of the present invention;

FIG. 10C is a simplified diagram illustrating a top view of an integrated MEMS-CMOS according to an embodiment of the present invention;

FIG. 12A is a simplified diagram illustrating a cross-sectional view of an integrated MEMS-CMOS according to an embodiment of the present invention;

FIG. 12B is a simplified diagram illustrating a cross-sectional view of an integrated MEMS-CMOS according to an embodiment of the present invention;

FIG. 13A is a simplified diagram illustrating a cross-sectional view of an integrated MEMS-CMOS according to an embodiment of the present invention;

FIG. 13B is a simplified diagram illustrating a cross-sectional view of an integrated MEMS-CMOS according to an embodiment of the present invention;

FIG. 15A is a simplified diagram illustrating a top view of a spring structure according to an embodiment of the present invention;

FIG. 15B is a simplified diagram illustrating a top view of a spring structure according to an embodiment of the present invention;

FIG. 16A is a simplified diagram illustrating a top view of a spring structure according to an embodiment of the present invention;

FIG. 16B is a simplified diagram illustrating a top view of a spring structure according to an embodiment of the present invention;

FIG. 19A is a simplified diagram illustrating a top view of an integrated MEMS-CMOS according to an embodiment of the present invention;

FIG. 19B is a simplified diagram illustrating a side view of an integrated MEMS-CMOS according to an embodiment of the present invention;

FIG. 19C is a simplified diagram illustrating a top view of an integrated MEMS-CMOS according to an embodiment of the present invention;

FIG. 19D is a simplified diagram illustrating a side view an integrated MEMS-CMOS according to an embodiment of the present invention;

FIG. 23A is a simplified diagram illustrating a top view of an integrated MEMS-CMOS according to an embodiment of the present invention;

FIG. 23B is a simplified diagram illustrating a top view of an integrated MEMS-CMOS according to an embodiment of the present invention;

DETAILED DESCRIPTION OF THE INVENTION

Figures 4A, 4B:
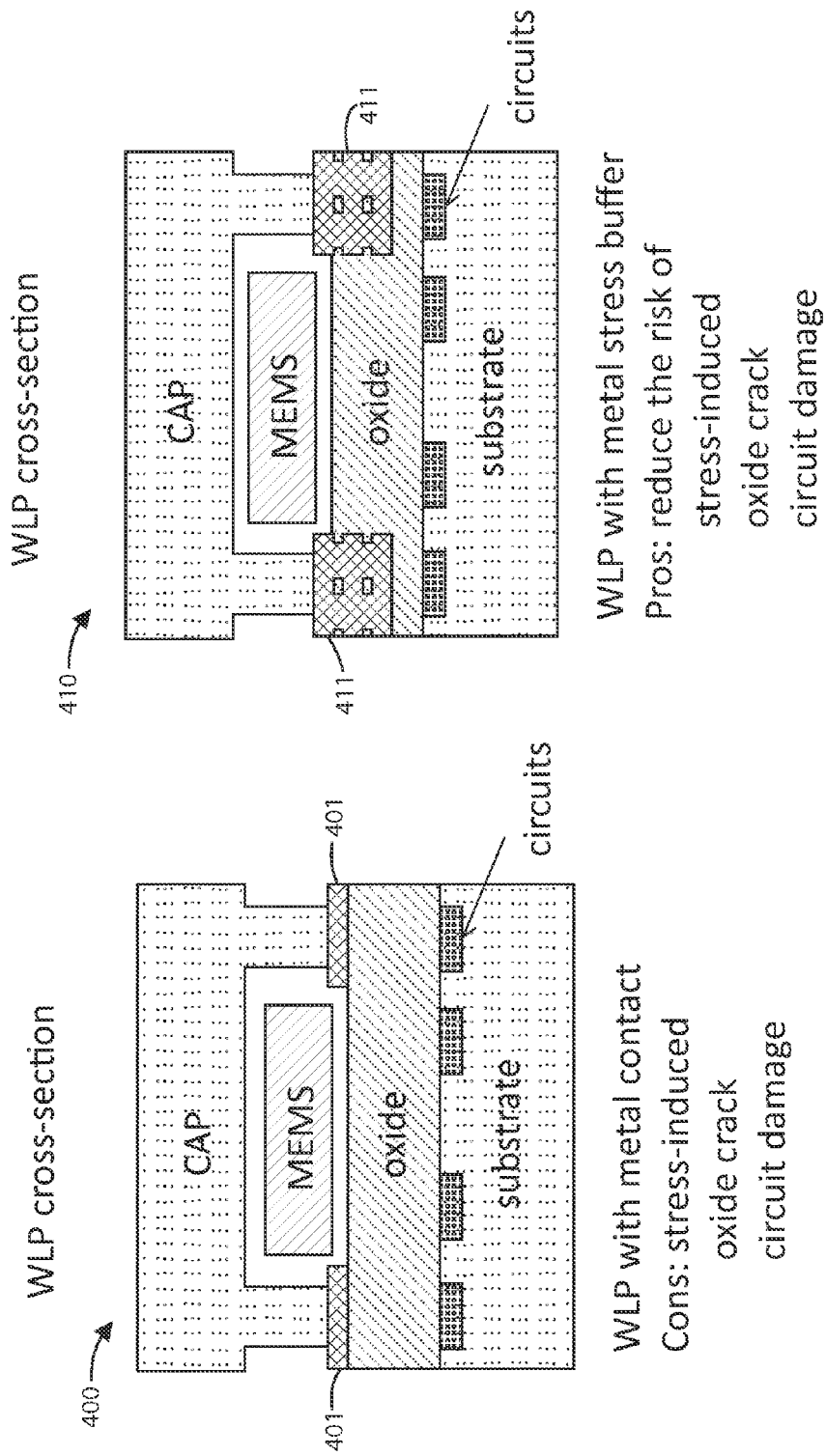
FIG. 4A is a simplified diagram illustrating a cross-sectional view of a wafer level package (WLP) according to an embodiment of the present invention.
FIG. 4B is a simplified diagram illustrating a cross-sectional view of a WLP including metal stress buffers according to an embodiment of the present invention.

The present invention is directed to MEMS (Micro-Electro-Mechanical-Systems). More specifically, embodiments of the invention provide methods and structure for improving integrated MEMS devices, including inertial sensors and the like. Merely by way of example, the MEMS device can include at least an accelerometer, a gyroscope, a magnetic sensor, a pressure sensor, a microphone, a humidity sensor, a temperature sensor, a chemical sensor, a biosensor, an inertial sensor, and others. But it will be recognized that the invention has a much broader range of applicability.

FIG. 1A is a simplified diagram illustrating a top view of an integrated circuit chip that includes an asymmetric device in an asymmetric floor place. Here, two configurations 100, 110 are shown with an asymmetrical device 102, 112 having two anchor points 103, 113 overlying a substrate member 101, 111. The top configuration 100 has the anchors 103 configured on the upper left portion of the substrate 101, and the bottom configuration 110 has the anchors 113 configured on the middle left portion of the substrate 111. In both configurations, the anchors contact the substrate on the left half of the substrate, which can cause an uneven distribution of stress, weight, etc. This kind of uneven distribution can cause performance variations leading to error, degradation, etc.

An example of problems that can arise involve the asymmetrical device being a differential sensor device, such as a differential integrated MEMS-CMOS inertial device. During operation, an inertial device can oscillate with respect to the substrate across an anchor point having one or more anchors. The performance of the inertial device can depend on the coupling of devices upon the substrate chip and the overall load distribution of the chip. For instance, the oscillating motion of the device can become unbalanced and due to the uneven distribution of stress as one side of the substrate is coupled to anchors and the other side is not. This kind of unbalanced operation can cause the inertial sensor to perform less reliably and less accurately. Other kinds of MEMS-CMOS devices can encounter similar problems as well.

FIG. 1B is a simplified diagram illustrating a top view of an integrated circuit chip that includes an asymmetric device in a symmetric floor plan which includes dummy design according to an embodiment of the present invention. Here, two embodiments 120, 130 are shown with an asymmetrical device 122, 132 with anchors 123, 133 along the center of the substrate 121, 131. In order to balance the overall chip, a dummy region 124, 134 is provided adjacent to the asymmetrical device 122, 132. The weight distribution can be calibrated to become balanced, and the anchor region is centered. This can improve the overall chip balance, which can increase sensor performance and reliability.

FIG. 2A is a simplified diagram illustrating a top view of an arrangement 200 of parallel sensing electrodes 201 according to an embodiment of the present invention. A limitation of this conventional arrangement 200 is the large cross-talk capacitance Cct. Note that here and in subsequent figures, Cct denotes cross-talk capacitance. Cdm denotes dummy capacitance. Cs+ denotes a capacitance of the + sensing electrode, and Cs− denotes a capacitance of the − sensing electrode.

FIG. 2B is a simplified diagram illustrating a top view of separated parallel sensing electrodes 211 according to an embodiment of the present invention. This arrangement 210 has the advantage of a small cross-talk capacitance Cct, but may suffer from a differential etch bias. Forming the separated parallel sensing electrodes 211 can cause irregularities caused by the difficulty of performing a controlled etching process at varied distances.

FIG. 3A is a simplified diagram illustrating a top view of parallel sensing electrodes 301 with floating dummy fill 302 according to an embodiment of the present invention. Advantages of this arrangement 300 include a small cross-talk capacitance and the same etch bias for both electrodes.

FIG. 3B is a simplified diagram illustrating a top view of parallel sensing electrodes 311 with non-floating dummy fill 312 according to an embodiment of the present invention. Advantages of this arrangement include reducing the critical cross-talk capacitance with an increase of dummy capacitance Cdm, which is non-critical. In addition, the same etch bias is maintained.

FIG. 4A is a simplified diagram illustrating a cross-sectional view of a wafer level package (WLP) 400 according to an embodiment of the present invention. The WLP includes a cap coupled to metal contacts 401 and enclosing a MEMS device overlying an IC substrate separated by an oxide layer. A disadvantage of this arrangement is potential for a stress-induced oxide crack or IMD crack, which may lead to circuit damages. The energy and force from coupling the cap can cause enough pressure to crack the oxide layer and cause damage to the circuitry below.

FIG. 4B is a simplified diagram illustrating a cross-sectional view of a WLP 410, similar to that shown in FIG. 4A, including metal stress buffers 411 according to an embodiment of the present invention. Here, a metal stress buffer 411 is provided underlying the contact regions of the cap. This arrangement has the advantages of reducing the risk of stress-induced oxide crack and circuit damages.

Figures 5A, 5B:
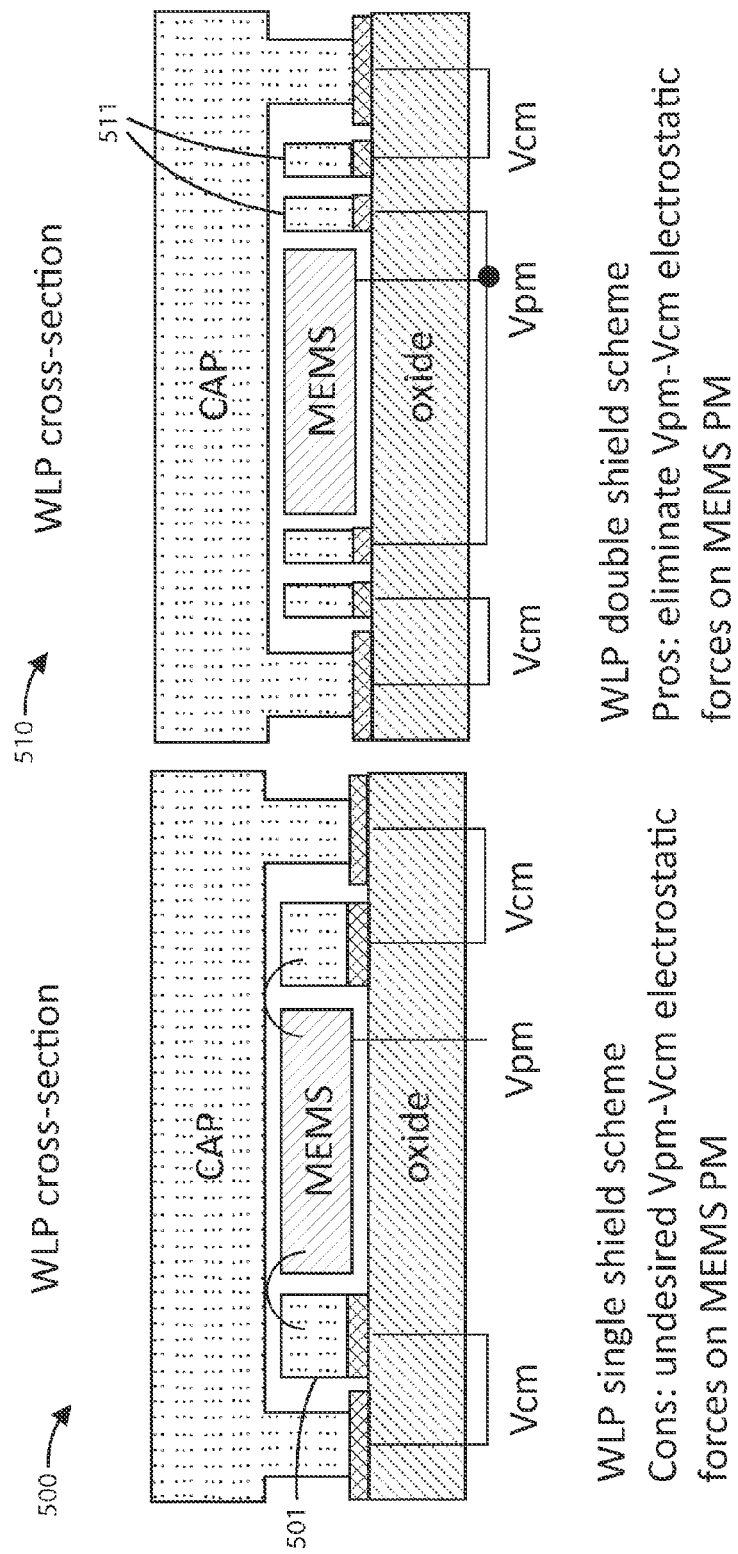
FIG. 5A is a simplified diagram illustrating a cross-sectional view of a WLP single shield scheme according to an embodiment of the present invention.
FIG. 5B is a simplified diagram illustrating a view of a WLP double shield scheme according to an embodiment of the present invention.

FIG. 5A is a simplified diagram illustrating a cross-sectional view of a WLP 500 with a single shield scheme 501 according to an embodiment of the present invention. This arrangement has undesired Vpm-Vcm electrostatic forces on the MEMS PM.

FIG. 5B is a simplified diagram illustrating a view of a WLP 510 with a double shield scheme 511 according to an embodiment of the present invention. This scheme reduces Vpm-Vcm electrostatic forces on MEMS PM.

FIG. 6A is a simplified diagram illustrating a cross-sectional view of an integrated MEMS-CMOS according to an embodiment of the present invention. A disadvantage of this arrangement 600 is the risk of plasma damage of CMOS circuits or PID.

FIG. 6B is a simplified diagram illustrating a cross-sectional view of an integrated MEMS-CMOS according to an embodiment of the present invention. This embodiment 610 includes an arrangement using MEMS jumpers used to couple via structures 611 that can reduce the risk of plasma damage of CMOS circuits or PID. The CMOS circuits can remain decoupled while the MEMS device is being etched, and then coupled through the via structures 611 by a MEMS jumper.

FIG. 7A is a simplified diagram illustrating a cross-sectional view of an integrated MEMS-CMOS according to an embodiment of the present invention. A disadvantage of this arrangement is the MEMS PM-CMOS circuits cross talk (shown by the dotted lines).

FIG. 7B is a simplified diagram illustrating a cross-sectional view of an integrated MEMS-CMOS according to an embodiment of the present invention. This embodiment includes an arrangement using an integrated top metal shield 711 that can reduce the MEMS PM-CMOS circuits crosstalk.

Figures 8A, 8B:
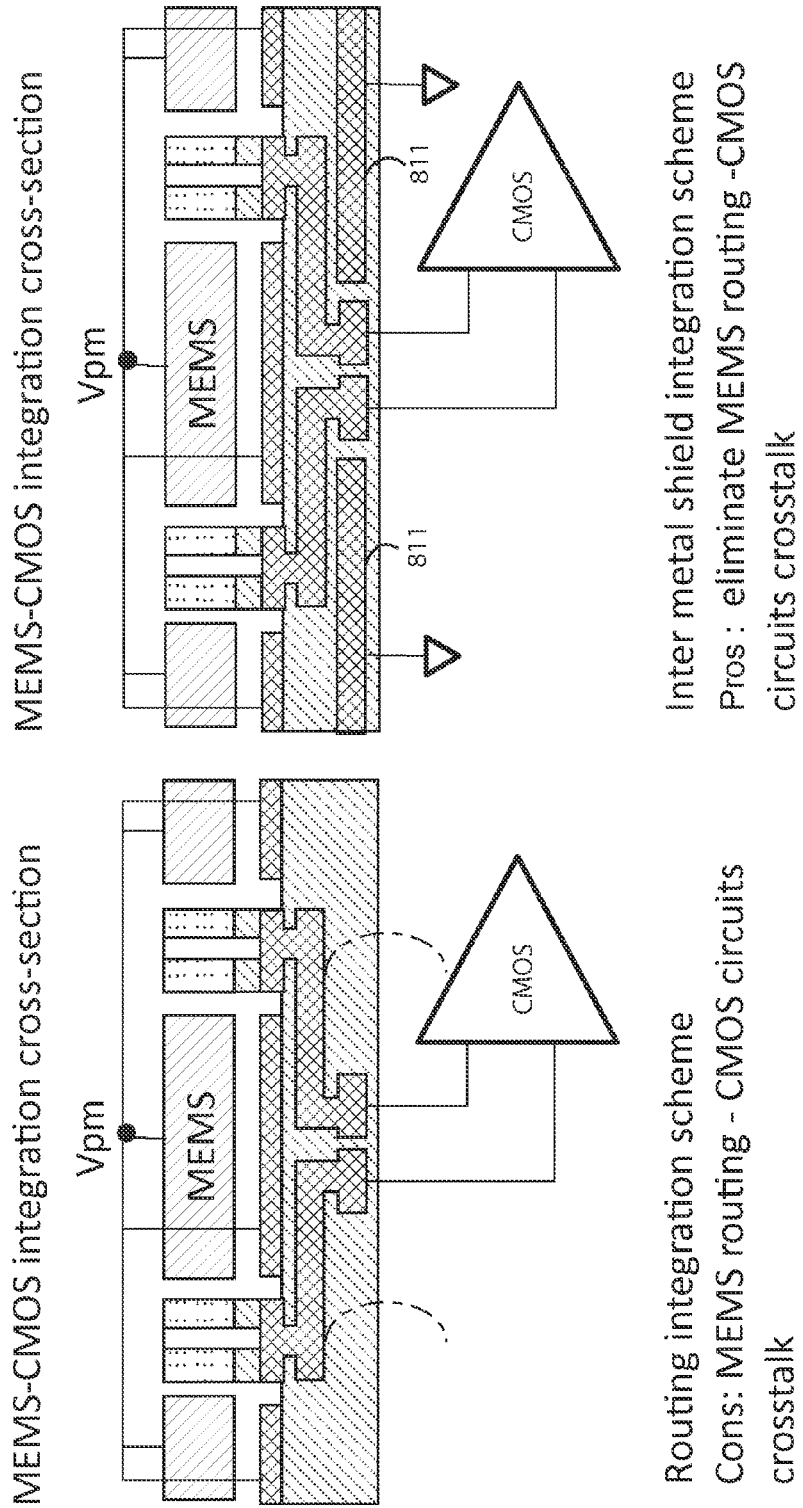
FIG. 8A is a simplified diagram illustrating a cross-sectional view of a routing scheme for an integrated MEMS-CMOS according to an embodiment of the present invention.
FIG. 8B is a simplified diagram illustrating a cross-sectional view of an inter-metal routing scheme for an integrated MEMS-CMOS according to an embodiment of the present invention.

FIG. 8A is a simplified diagram illustrating a cross-sectional view of a routing scheme for an integrated MEMS-CMOS according to an embodiment of the present invention. A disadvantage of this arrangement is the MEMS routing-CMOS circuits crosstalk (shown by the dotted lines).

FIG. 8B is a simplified diagram illustrating a cross-sectional view of an inter-metal routing scheme for an integrated MEMS-CMOS according to an embodiment of the present invention. This embodiment includes an arrangement using an integrated inter metal shield 811 that can reduce the MEMS routing-CMOS circuits crosstalk.

FIG. 9A is a simplified diagram illustrating a cross-sectional view of an integrated MEMS-CMOS according to an embodiment of the present invention. A disadvantage of this arrangement is the risk of plasma damage of the CMOS circuits or PID.

FIG. 9B is a simplified diagram illustrating a cross-sectional view of an integrated MEMS-CMOS including ESD structures 911 according to an embodiment of the present invention. This embodiment includes an arrangement using ESD structures 911 to reduce the risk of plasma damage to the CMOS circuits.

FIG. 10A is a simplified diagram illustrating a top view of an integrated MEMS-CMOS according to an embodiment of the present invention. This embodiment 1000 includes an arrangement with a 3-axis integrated MEMS-CMOS device using a dummy region similar to the configuration described in FIG. 1B. Here, the anchors are centered on the substrate, and the dummy region is adjacent to the 3-axis device, which is an asymmetric dual proof mass 3-axis inertial sensing device. In this embodiment, the cross-axis sensitivity is good, but the proof masses are small due to using separate proof masses for the X-Y axis device and the Z axis device. This configuration can reduce the differential offset due to package stresses.

FIG. 10B is a simplified diagram illustrating a top view of an integrated MEMS-CMOS according to an embodiment of the present invention. This embodiment 1010 includes an arrangement with a 3-axis integrated MEMS-CMOS device using a dummy region as well. Here, the device is an asymmetric single proof mass 3-axis integrated inertial sensing device. Fewer anchors can be used in this embodiment compared to the dual proof mass embodiment. In this embodiment, the proof mass is bigger than the embodiment shown in FIG. 10A, but the cross-axis sensitivity is bad compared to the FIG. 10A embodiment. This configuration can also reduce the differential offset due to package stresses.

FIG. 10C is a simplified diagram illustrating a top view of an integrated MEMS-CMOS according to an embodiment of the present invention. This embodiment 1020 includes an arrangement with a 3-axis integrated MEMS-CMOS device without a dummy region. Here, the device is a symmetric single proof mass 3-axis integrated inertial sensing device. Similar to the FIG. 10B embodiment, fewer anchors are necessary. The device is symmetrically formed with an increased proof mass size in a balanced shape. The Z axis device is coupled to the X-Y axis device by springs, and the X-Y axis device is anchored to the substrate. In this embodiment, the proof mass is the largest compared to the embodiments of FIGS. 10A and 10B, and the cross-axis sensitivity remains good. This is another configuration that can reduce the differential offset due to package stresses.

Figure 11A:
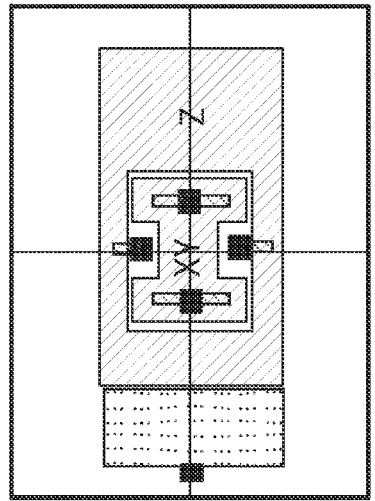
FIG. 11A is a simplified diagram illustrating a top view of an integrated MEMS-CMOS according to an embodiment of the present invention.

FIG. 11A is a simplified diagram illustrating a top view of an integrated MEMS-CMOS according to an embodiment of the present invention. This diagram 1100 illustrates an arrangement similar to that shown in FIG. 10A, which is an asymmetric dual proof mass inertial sensing device using a dummy region. The substrate stiffness is asymmetric in this embodiment, which can provide a source of differential offset due to package stresses.

Figure 11B:
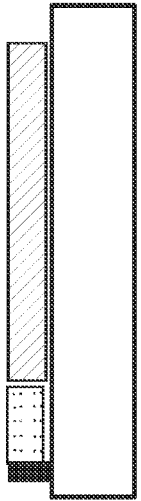
FIG. 11B is a simplified diagram illustrating a side view of an integrated MEMS-CMOS according to an embodiment of the present invention.

FIG. 11B is a simplified diagram illustrating a side view of an integrated MEMS-CMOS according to an embodiment of the present invention. This diagram 1110 illustrates the side view of the embodiment shown in FIG. 11A. As shown, the dummy region is coupled to the substrate.

Figure 11C:
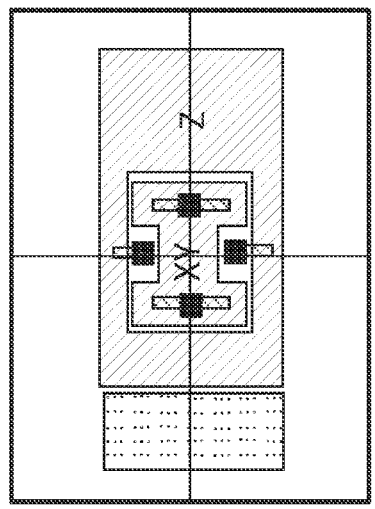
FIG. 11C is a simplified diagram illustrating a top view of an integrated MEMS-CMOS according to an embodiment of the present invention.

FIG. 11C is a simplified diagram illustrating a top view of an integrated MEMS-CMOS according to an embodiment of the present invention. This diagram 1120 illustrates an asymmetric dual proof mass inertial sensing device using a floating dummy region. Here, the asymmetric stiffness of the substrate is reduced by reducing the contact of the dummy region with the substrate. This can be by coupling the dummy region through other structures, such as the device (similar to the embodiment of FIG. 10C), or through an anchor or the like. In this manner, the differential offset due to substrate stresses can be reduced.

Figure 11D:
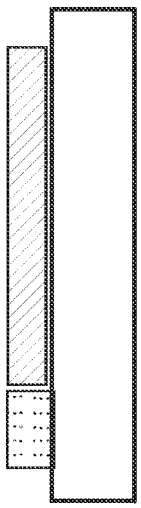
FIG. 11D is a simplified diagram illustrating a side view of an integrated MEMS-CMOS according to an embodiment of the present invention.

FIG. 11D is a simplified diagram illustrating a side view of an integrated MEMS-CMOS according to an embodiment of the present invention. This diagram 1130 illustrates the side view of the embodiment shown in FIG. 11C. As shown, the dummy region is floating, and is coupled to the substrate indirectly, such as with an anchor.

FIG. 12A is a simplified diagram illustrating a cross-sectional view of an integrated MEMS-CMOS according to an embodiment of the present invention. This diagram 1200 illustrates an integrated MEMS-CMOS device showing the integration between the MEMS and CMOS metal layers. A disadvantage of this configuration includes the risk of plasma damage to the circuitry or PID.

FIG. 12B is a simplified diagram illustrating a cross-sectional view of an integrated MEMS-CMOS according to an embodiment of the present invention. This embodiment 1210 includes an integrated MEMS-CMOS device using an electrode ground ring or a plasma protect ring 1211 integrated underlying the MEMS. The electrode ground ring 1211 includes a ring of metal layers grounded to act similarly to a lightning rod to reduce the risk of plasma damage to the circuitry or PID.

FIG. 13A is a simplified diagram illustrating a cross-sectional view of an integrated MEMS-CMOS according to an embodiment of the present invention. This embodiment 1300 includes an integrated MEMS-CMOS device using a MEMS jumper integration. The MEMS and CMOS are left disconnected to be connected later by a MEMS jumper. This embodiment can reduce the plasma damage of the bottom electrode process, but there can still be risk of plasma damage during the MEMS structure process.

FIG. 13B is a simplified diagram illustrating a cross-sectional view of an integrated MEMS-CMOS according to an embodiment of the present invention. This embodiment 1310 includes an integrated MEMS-CMOS device using a MEMS jumper integration with a ground structure. The grounded structure, which can be a via structure 1311, can act like a lightning rod to provide a lower resistance path to ground rather than through the CMOS circuitry. This can reduce the risk of plasma damage to the circuitry.

Figure 14A:
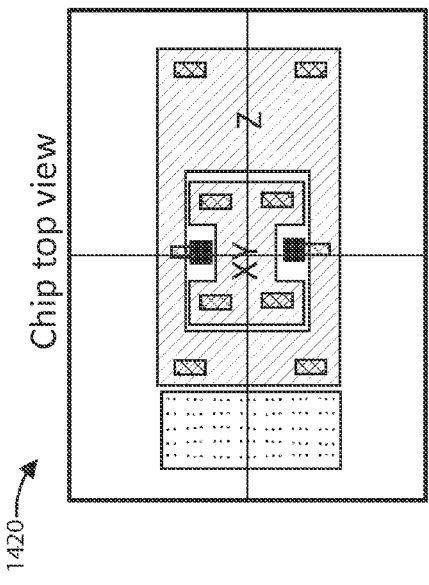
FIG. 14A is a simplified diagram illustrating a top view of an integrated MEMS-CMOS according to an embodiment of the present invention.

FIG. 14A is a simplified diagram illustrating a top view of an integrated MEMS-CMOS according to an embodiment of the present invention. This embodiment 1400 includes a 3-axis integrated MEMS-CMOS inertial sensor using stop structures. MEMS devices having moving parts, such as oscillators, can run the risk of experience stiction from contact with another surface. Stop structures can be used to reduce the risk of stiction through reducing the surface area of contact during motion. As shown, the device includes stop structures for the X-Y axis structure and stop structures for the Z axis structure.

Figure 14C:
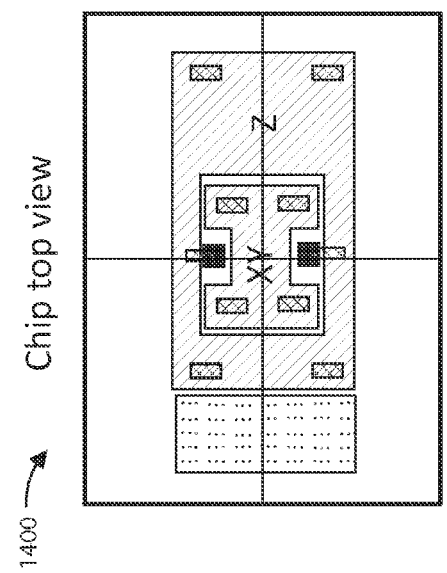
FIG. 14C is a simplified diagram illustrating a top view of an integrated MEMS-CMOS according to an embodiment of the present invention.
Figure 14B:
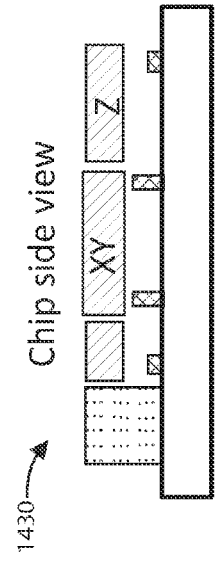
FIG. 14B is a simplified diagram illustrating a side view of an integrated MEMS-CMOS according to an embodiment of the present invention.

FIG. 14B is a simplified diagram illustrating a side view of an integrated MEMS-CMOS according to an embodiment of the present invention. This diagram 1410 illustrates the side view of the embodiment shown in FIG. 14A. As shown, stop structures are formed underlying the X-Y axis and Z-axis structures. These stop structures reduce the risk of stiction of the X-Y and Z axis structures.

FIG. 14C is a simplified diagram illustrating a top view of an integrated MEMS-CMOS according to an embodiment of the present invention. This embodiment 1420 includes an integrated MEMS-CMOS device using variable stop structures. As shown, the device includes stop structures for the X-Y axis structure similar to those in the embodiment of FIG. 14A, and recessed stop structures for the Z axis structure. These recessed stop structures can further reduce the risk of stiction for the Z-axis structure compared to the embodiment shown in FIGS. 14A and 14B.

Figure 14D:
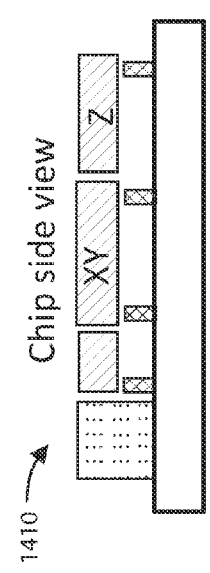
FIG. 14D is a simplified diagram illustrating a side view of an integrated MEMS-CMOS according to an embodiment of the present invention.

FIG. 14D is a simplified diagram illustrating a side view of an integrated MEMS-CMOS according to an embodiment of the present invention. This diagram 1430 illustrates the side view of the embodiment shown in FIG. 14C. As shown, the stop structures are formed underlying the X-Y axis structure and the recessed stop structures are formed underlying the Z axis device.

FIG. 15A is a simplified diagram illustrating a top view of a spring structure according to an embodiment of the present invention. This embodiment 1500 includes a serpentine spring structure coupled to an anchor and a device. A disadvantage of this embodiment is the risk of stiction at the joints of the serpentine structure.

FIG. 15B is a simplified diagram illustrating a top view of a spring structure according to an embodiment of the present invention. This embodiment 1510 includes a staggered or step-wise serpentine structure coupled to an anchor and a device. The step-wise arrangement of the spring joints reduces the risk of stiction of the serpentine structure.

FIG. 16A is a simplified diagram illustrating a top view of a spring structure according to an embodiment of the present invention. This embodiment 1600 includes a crab-leg spring structure having horizontal segments and vertical segments. The crab-leg spring structure can be a spring structure used for an X-Y inertial sensing device. The spring structure can be coupled to anchor structure and a device. A disadvantage of this configuration is the potential of the spring to rotate during operation. An undesired rotation of the X-Y device can reduce accuracy and reliability.

FIG. 16B is a simplified diagram illustrating a top view of a spring structure according to an embodiment of the present invention. This embodiment 1610 includes a reinforced crab-leg spring structure having horizontal segments, vertical segments, and reinforcing segments. The reinforced crab-leg spring structure can be a spring structure used for an X-Y inertial sensing device. In a specific embodiment, the reinforcing segments can be a U-shaped structure. The reinforcing segments can reduce the risk of spring rotation, which can increase performance and reliability through increased cross axis sensitivity.

Figures 17A, 17B:
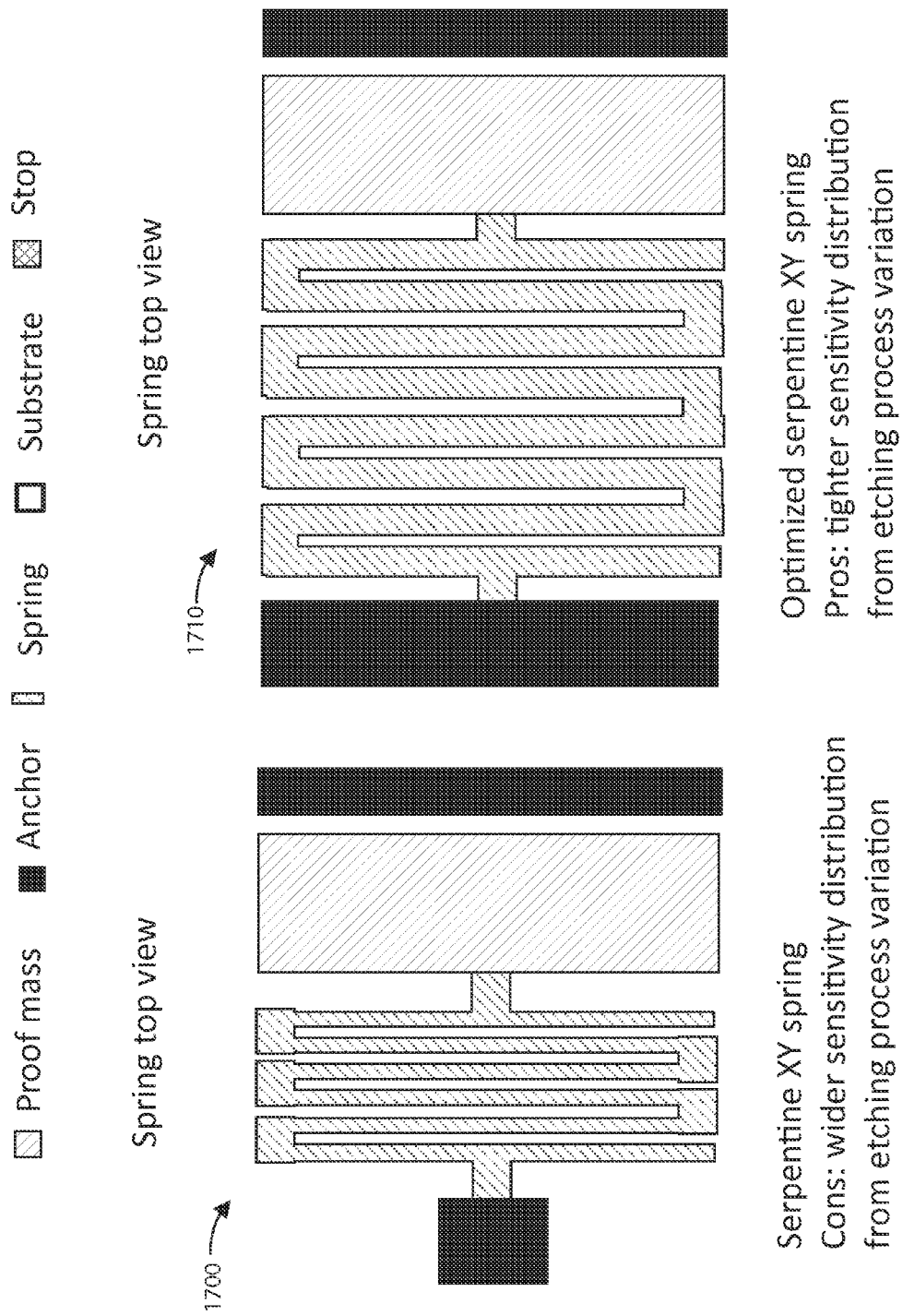
FIG. 17A is a simplified diagram illustrating a top view of a spring structure according to an embodiment of the present invention.
FIG. 17B is a simplified diagram illustrating a top view of a spring structure according to an embodiment of the present invention.

FIG. 17A is a simplified diagram illustrating a top view of a spring structure according to an embodiment of the present invention. This embodiment 1700 includes a serpentine spring structure similar to that of FIG. 15A. A disadvantage of this configuration is the wider sensitivity distribution from the etching process variation.

FIG. 17B is a simplified diagram illustrating a top view of a spring structure according to an embodiment of the present invention. This embodiment 1710 includes a serpentine spring structure of increased thickness and length. The advantages of this configuration include a tighter sensitivity distribution from the etching process variation.

Figure 18A:
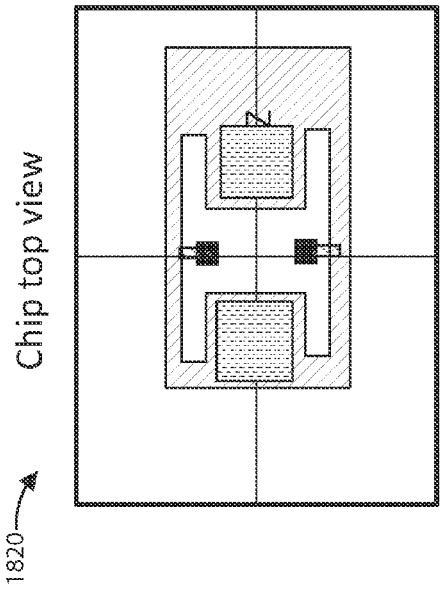
FIG. 18A is a simplified diagram illustrating a top view of an integrated MEMS-CMOS according to an embodiment of the present invention.

FIG. 18A is a simplified diagram illustrating a top view of an integrated MEMS-CMOS according to an embodiment of the present invention. This diagram 1800 illustrates an electrode design for a Z axis inertial sensing structure. Here, the electrodes are formed in a rectangular shape. A disadvantage of this configuration is a larger offset from the substrate deformation.

Figure 18B:
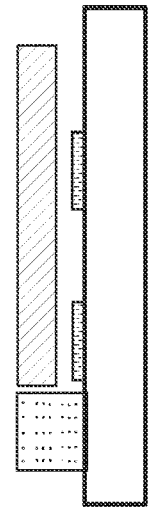
FIG. 18B is a simplified diagram illustrating a side view of an integrated MEMS-CMOS according to an embodiment of the present invention.

FIG. 18B is a simplified diagram illustrating a side view of an integrated MEMS-CMOS according to an embodiment of the present invention. This diagram 1810 is a side view of the embodiment shown in FIG. 18A. Here, a dummy region is shown adjacent to the Z axis device.

Figure 18C:
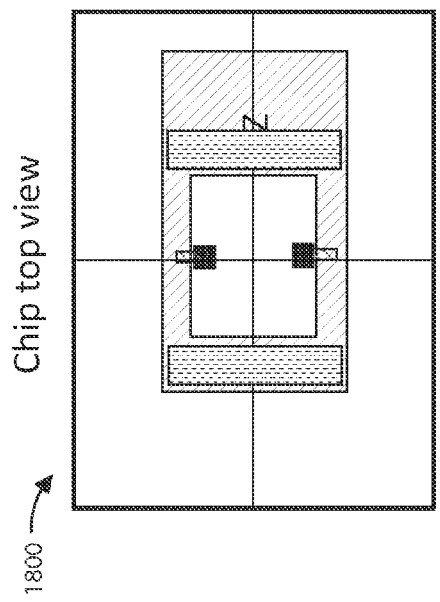
FIG. 18C is a simplified diagram illustrating a top view of an integrated MEMS-CMOS according to an embodiment of the present invention.

FIG. 18C is a simplified diagram illustrating a top view of an integrated MEMS-CMOS according to an embodiment of the present invention. This diagram 1820 illustrates an electrode design for a Z axis inertial sensing structure. Here, the electrodes are formed in a square shape. Advantages of this embodiment include a smaller offset from substrate deformation. Having a more centralized retrograde metal electrode can reduce the differential offset due to substrate stresses and improve performance.

Figure 18D:
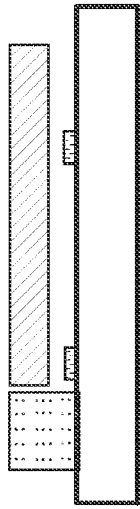
FIG. 18D is a simplified diagram illustrating a side view of an integrated MEMS-CMOS according to an embodiment of the present invention.

FIG. 18D is a simplified diagram illustrating a side view of an integrated MEMS-CMOS according to an embodiment of the present invention. This diagram 1830 is a side view of the embodiment shown in FIG. 18C. Here, a dummy region is shown adjacent to the Z axis device.

FIG. 19A is a simplified diagram illustrating a top view of an integrated MEMS-CMOS according to an embodiment of the present invention. This diagram 1900 illustrates a cap and the bonding region of the cap to the substrate. A disadvantage of this configuration is the risk for grind fracture for a thin substrate/cap process. The stress exerted on the cap across the unsupported center region can cause the cap to crack during a grinding process.

FIG. 19B is a simplified diagram illustrating a side view of an integrated MEMS-CMOS according to an embodiment of the present invention. This diagram 1910 is a side view of the embodiment shown in FIG. 19A.

FIG. 19C is a simplified diagram illustrating a top view of an integrated MEMS-CMOS according to an embodiment of the present invention. This diagram 1920 illustrates a cap structure having a bonding region and a central support overlying substrate. The advantages of this embodiment include a reduced grind fracture risk for a thin substrate/cap process. The central support can reduce the stress over the center region of the cap. This reduces the risk of the cap fracturing due to a grinding process to thin the cap structure.

FIG. 19D is a simplified diagram illustrating a side view an integrated MEMS-CMOS according to an embodiment of the present invention. This diagram 1930 is a side view of the embodiment shown in FIG. 19C. As shown, the bonding regions include the perimeter of the cap and the center portion of the cap.

Figure 20A:
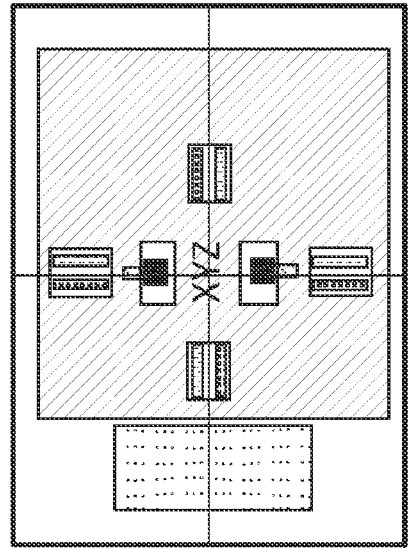
FIG. 20A is a simplified diagram illustrating a top view of an integrated MEMS-CMOS according to an embodiment of the present invention.

FIG. 20A is a simplified diagram illustrating a top view of an integrated MEMS-CMOS according to an embodiment of the present invention. This diagram 2000 illustrates an electrode configuration for an asymmetric single proof mass 3-axis inertial sensor design. Here, the inertial sensor includes a dummy region and four sets of electrodes configured about the center of the substrate. The horizontal P electrodes are configured on the upper half of the substrate, whereas the horizontal N electrodes are configured on the lower half of the substrate. Similarly, the vertical P electrodes are configured on the left half of the substrate, whereas the vertical N electrodes are configured on the right half of the substrate. A disadvantage of this configuration is bad cross-axis sensitivity, which is due to the dummy region adjacent to the 3-axis inertial sensing device. In a specific embodiment, the dummy region can cause a differential bias caused by substrate stresses, which leads to the inertial sensing device having an uneven performance in the y-direction.

Figure 20B:
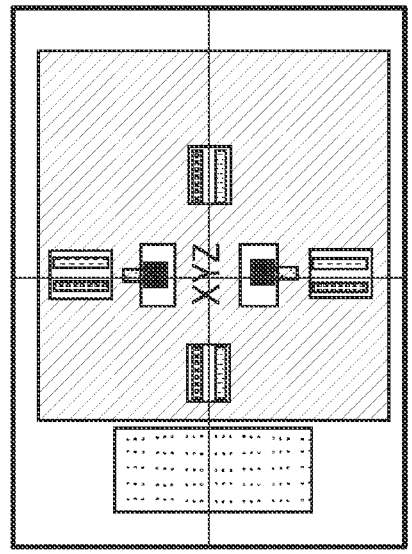
FIG. 20B is a simplified diagram illustrating a top view of an integrated MEMS-CMOS according to an embodiment of the present invention.

FIG. 20B is a simplified diagram illustrating a top view of an integrated MEMS-CMOS according to an embodiment of the present invention. This diagram 2010 illustrates an electrode configuration for an asymmetric single proof mass 3-axis inertial sensor design. Here, the inertial sensor includes a dummy region and four sets of electrodes configured about the center of the substrate. Similar to FIG. 20A, the vertical P electrodes are configured on the left half of the substrate and the vertical N electrodes are configured on the right half of the substrate. The horizontal P and N electrodes are configured in an alternating pattern, with one set having the P electrode on the upper half and the N electrode on the lower half and the other set in the opposite fashion. This differential configuration can reduce the effect of the differential bias due to substrate stresses, and can improve cross-axis sensitivity.

Figure 21A:
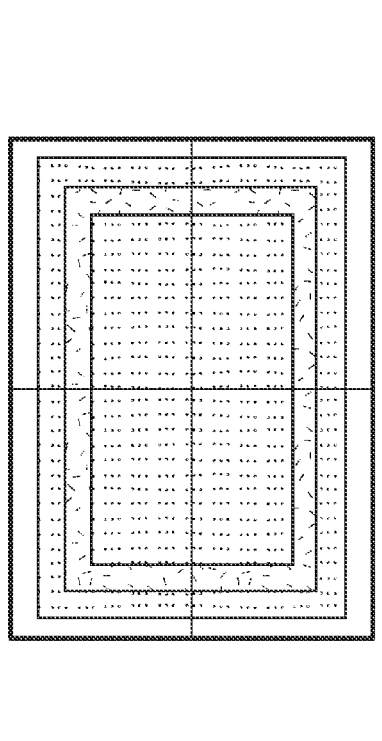
FIG. 21A is a simplified diagram illustrating a top view of an integrated MEMS-CMOS according to an embodiment of the present invention.

FIG. 21A is a simplified diagram illustrating a top view of an integrated MEMS-CMOS according to an embodiment of the present invention. This diagram 2100 illustrates a top view of a packaged chip.

Figure 21C:
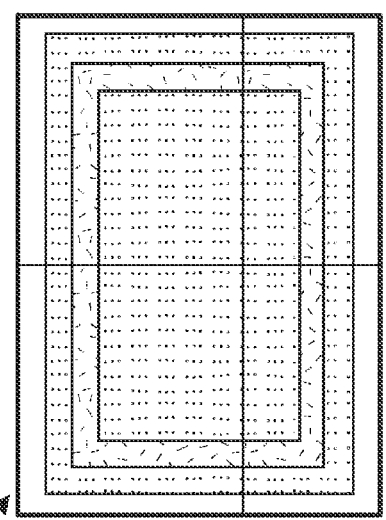
FIG. 21C is a simplified diagram illustrating a top view of an integrated MEMS-CMOS according to an embodiment of the present invention.
Figure 21B:
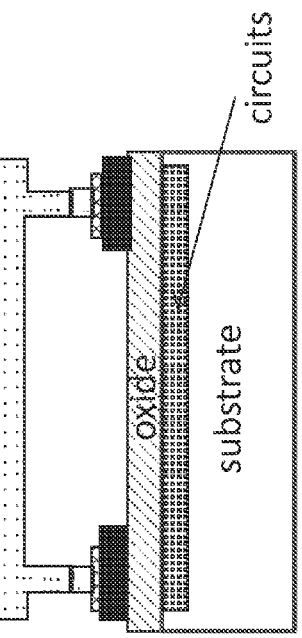
FIG. 21B is a simplified diagram illustrating a side view of an integrated MEMS-CMOS according to an embodiment of the present invention.

FIG. 21B is a simplified diagram illustrating a side view of an integrated MEMS-CMOS according to an embodiment of the present invention. This diagram 2110 is the side view of the embodiment shown in FIG. 21A. Here, the circuit region is limited due to the risk of damage from the cap structure being attached. The high stress of the cap bond region causes a high risk of circuit failure, reducing the effective area for circuitry.

FIG. 21C is a simplified diagram illustrating a top view of an integrated MEMS-CMOS according to an embodiment of the present invention. This diagram 2120 illustrates a top view of a packaged chip.

Figure 21D:
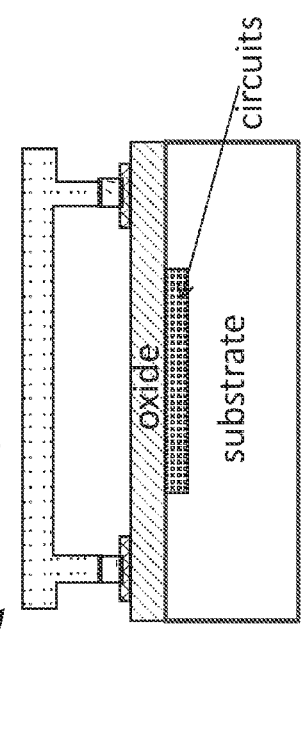
FIG. 21D is a simplified diagram illustrating a side view an integrated MEMS-CMOS according to an embodiment of the present invention.

FIG. 21D is a simplified diagram illustrating a side view an integrated MEMS-CMOS according to an embodiment of the present invention. This diagram 2130 is the side view of the embodiment shown in FIG. 21C. Here, the circuit region is expanded due to the use of anchor structures to reduce the risk of damage from the cap bonding process. As shown, the circuit region is expanded to the regions underlying the bond regions. This configuration can also be used to reduce the chip area without reducing the circuitry area.

Figures 22A, 22B:
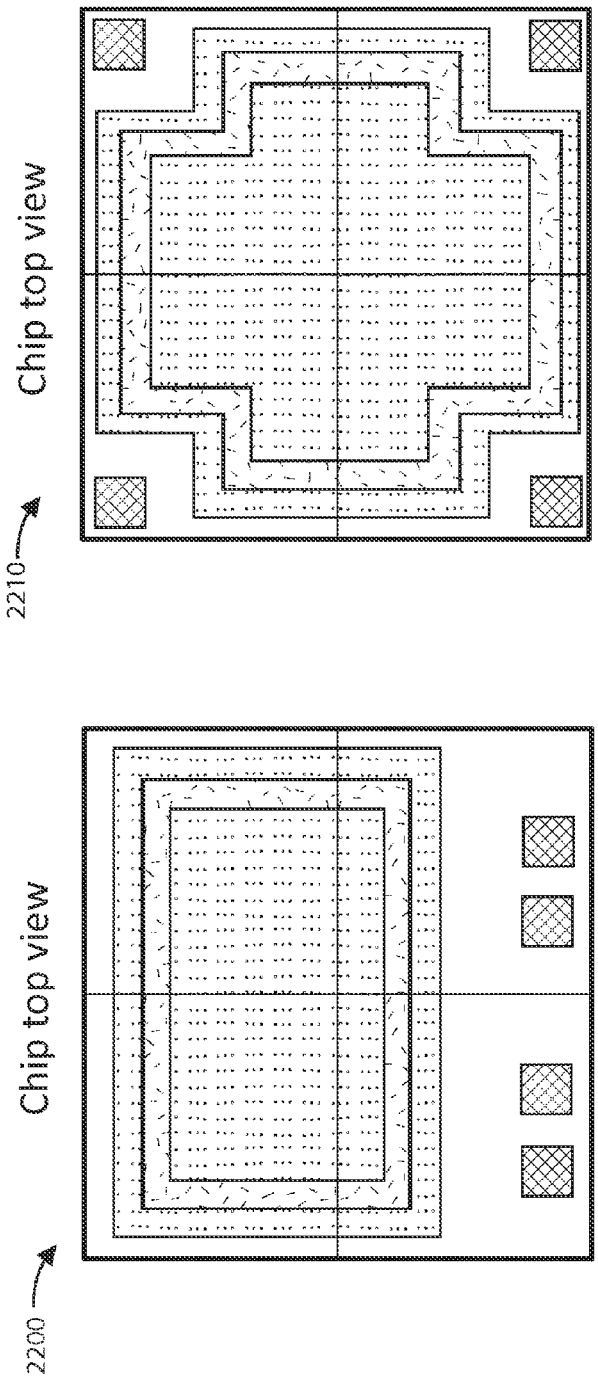
FIG. 22A is a simplified diagram illustrating a top view of an integrated MEMS-CMOS according to an embodiment of the present invention.
FIG. 22B is a simplified diagram illustrating a top view of an integrated MEMS-CMOS according to an embodiment of the present invention.

FIG. 22A is a simplified diagram illustrating a top view of an integrated MEMS-CMOS according to an embodiment of the present invention. This diagram 2200 illustrates an integration scheme for a packaged device in which the bond pads are configured on one side of the chip substrate. A disadvantage of this scheme includes the asymmetric design due to the offset of the device from the center of the chip. As stated previously, the asymmetric design can cause differential biases due to substrate stresses.

FIG. 22B is a simplified diagram illustrating a top view of an integrated MEMS-CMOS according to an embodiment of the present invention. This diagram 2210 illustrates an integration scheme for a packaged device in which the bond pads are configured on each corner of the chip substrate. The advantages of the scheme include the symmetric design without an offset from the center of the chip substrate, which can reduce differential biases due to substrate stresses.

FIG. 23A is a simplified diagram illustrating a top view of an integrated MEMS-CMOS according to an embodiment of the present invention. This diagram 2300 illustrates an integration scheme similar to that which is shown in FIG. 22B. In this embodiment, the devices packaged underlying the cap are configured in a parallel manner. A disadvantage of this scheme is the differential biases due to the offset of the devices, particularly for the devices that are not configured in the center of the chip substrate.

FIG. 23B is a simplified diagram illustrating a top view of an integrated MEMS-CMOS according to an embodiment of the present invention. This diagram 2310 illustrates an integration scheme similar to that which is shown in FIG. 22B. In this embodiment, the devices packaged underlying the cap are configured in a concentric manner. This scheme can reduce the differential biases due to substrate stresses, and thus improve performance of the device.

In an embodiment, the present method uses a micro-fabrication process that realizes moving mechanical structures (MEMS) on top of a conventional CMOS structure by bonding a mechanical structural wafer on top of the CMOS and etching the mechanical layer using plasma etching processes, such as Deep Reactive Ion Etching (DRIE). During etching of the mechanical layer, CMOS devices that are directly connected to the mechanical layer are exposed to plasma. This sometimes causes permanent damage to CMOS circuits and is termed Plasma Induced Damage (PID). Embodiments of the present invention presents methods and structures to prevent or reduce this PID and protect the underlying CMOS circuits by grounding and providing an alternate path for the CMOS circuits until the MEMS layer is completely etched.

Figure 24:
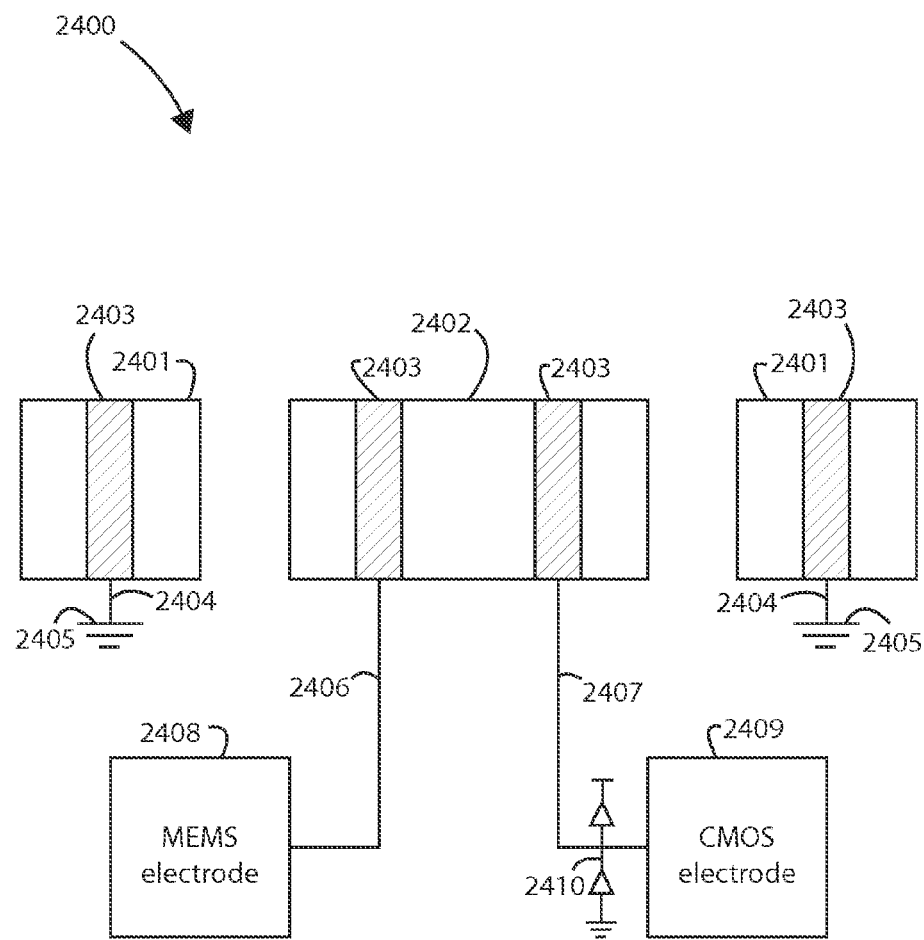
FIG. 24 illustrates a simplified block diagram of a protected integrated MEMS-CMOS device according to an embodiment of the present invention.

FIG. 24 illustrates a simplified block diagram of a protected integrated MEMS-CMOS device according to an embodiment of the present invention. As shown, the device 2400 can include ground posts 2401, jumper 2402, vias 2403, MEMS-to-ground connections 2404, grounds 2405, MEMS-to-jumper connection 2406, CMOS-to-jumper connection 2407, MEMS electrode 2408, CMOS electrode 2409, and ESD (Electrostatic discharge) diode 2410. CMOS electrode 2409 is the electrode that has to be protected from plasma damage. In an embodiment, a two-level protection structure is employed.

In an embodiment, the present invention provides a method of fabricating an integrated MEMS-CMOS device. The method can include providing a substrate having a surface region, forming a CMOS IC layer with at least one CMOS electrode overlying the surface region, forming a mechanical structural layer overlying the CMOS IC layer, forming one or more MEMS devices overlying the CMOS IC layer from a first portion of the mechanical structural layer, forming a protection structure coupled to the at least one CMOS electrode, and forming one or more MEMS devices coupled to the protection structure overlying the CMOS IC layer from a second portion of the mechanical structural layer. The protection structure can include one or more ground posts, a jumper, and an ESD diode. The resulting integrated MEMS-CMOS device includes an integrated device with a MEMS layer overlying a CMOS IC layer overlying a substrate, in which a protection structure is integrated in the MEMS layer and coupled to both the MEMS layer and the CMOS IC layer.

In an embodiment, the first level of protection comes with the CMOS electrode 2409 being connected to ground until the mechanical layer is completely etched. The electrical ground 2405 of the CMOS is a large conductive plane that is connected to the earth of the plasma etching system through the CMOS substrate. This provides an alternative path for the plasma and connects the MEMS electrode 2408 to the CMOS electrode 2409.

In an embodiment, the second level of protection comes with the ESD diode 2410 that is used at the input of the CMOS electrode 2409 that clamps large negative voltages at the input node to ground.

In a specific embodiment, ground posts 2401 are part of the electrically conductive mechanical structural layer (MEMS), which is non-moving, that serves as an electrical ground during definition (etching) of the mechanical layer (MEMS).

In a specific embodiment, jumper 2402 is part of the electrically conductive mechanical structural layer, which is non-moving, that serves as an electrical connection between the mechanical layer (MEMS) and CMOS, only after the mechanical layer (MEMS) is released (i.e., completely etched).

In a specific embodiment, vias 2403 are electrically conductive via providing connection to the mechanical layer.

In a specific embodiment, connections 2404 are electrical connections between the mechanical structure (MEMS) and the electrical grounds 2405.

In a specific embodiment, ground 2405 is an electrical ground that is connected to earth through the equipment that defines/etches the mechanical structure layer (MEMS).

In a specific embodiment, connection 2406 is an electrical connection between jumper 2402 and MEMS electrode 2408, which is used to actuate/sense mechanical motion.

In a specific embodiment, connection 2407 is an electrical connection between jumper 2402 and CMOS electrode 2409, which is used to actuate/sense mechanical motion in the electrical domain.

In a specific embodiment, ESD diode 2410 is an electrostatic discharge protection diode connection between a power supply and ground.

Figure 25:
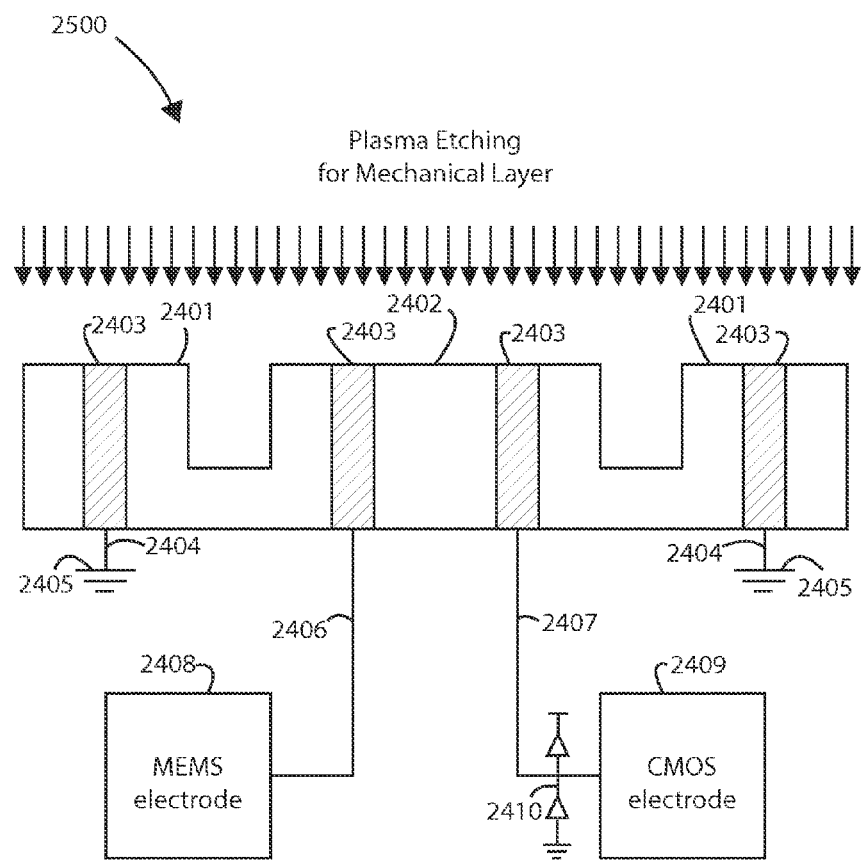
FIG. 25 illustrates a simplified block diagram of a method step for forming protection structures in an integrated MEMS-CMOS device according to an embodiment of the present invention.

FIG. 25 illustrates a simplified block diagram of a method step for forming protection structures in an integrated MEMS-CMOS device according to an embodiment of the present invention. Device 2500 shown here illustrates a step wherein the mechanical layer (MEMS) is being released, but has not been fully released, i.e. during etching. The elements found in device 2500 are similar to those of device 2400 in FIG. 24.

Figure 26:
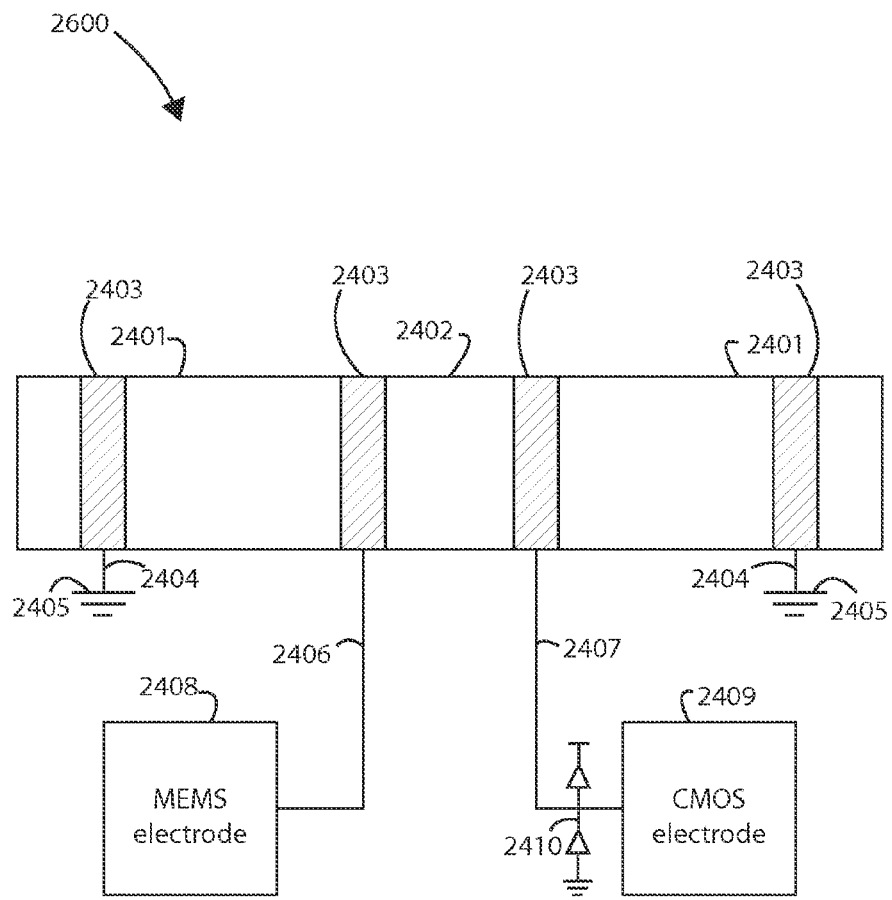
FIG. 26 illustrates a simplified block diagram of a method step for forming protection structures in an integrated MEMS-CMOS device according to an embodiment of the present invention.

FIG. 26 illustrates a simplified block diagram of a method step for forming protection structures in an integrated MEMS-CMOS device according to an embodiment of the present invention. Device 2600 shown here illustrates a step prior to defining or etching of the mechanical (MEMS) layer. The elements found in device 2600 are similar to those of device 2400 in FIG. 24.

Figure 27:
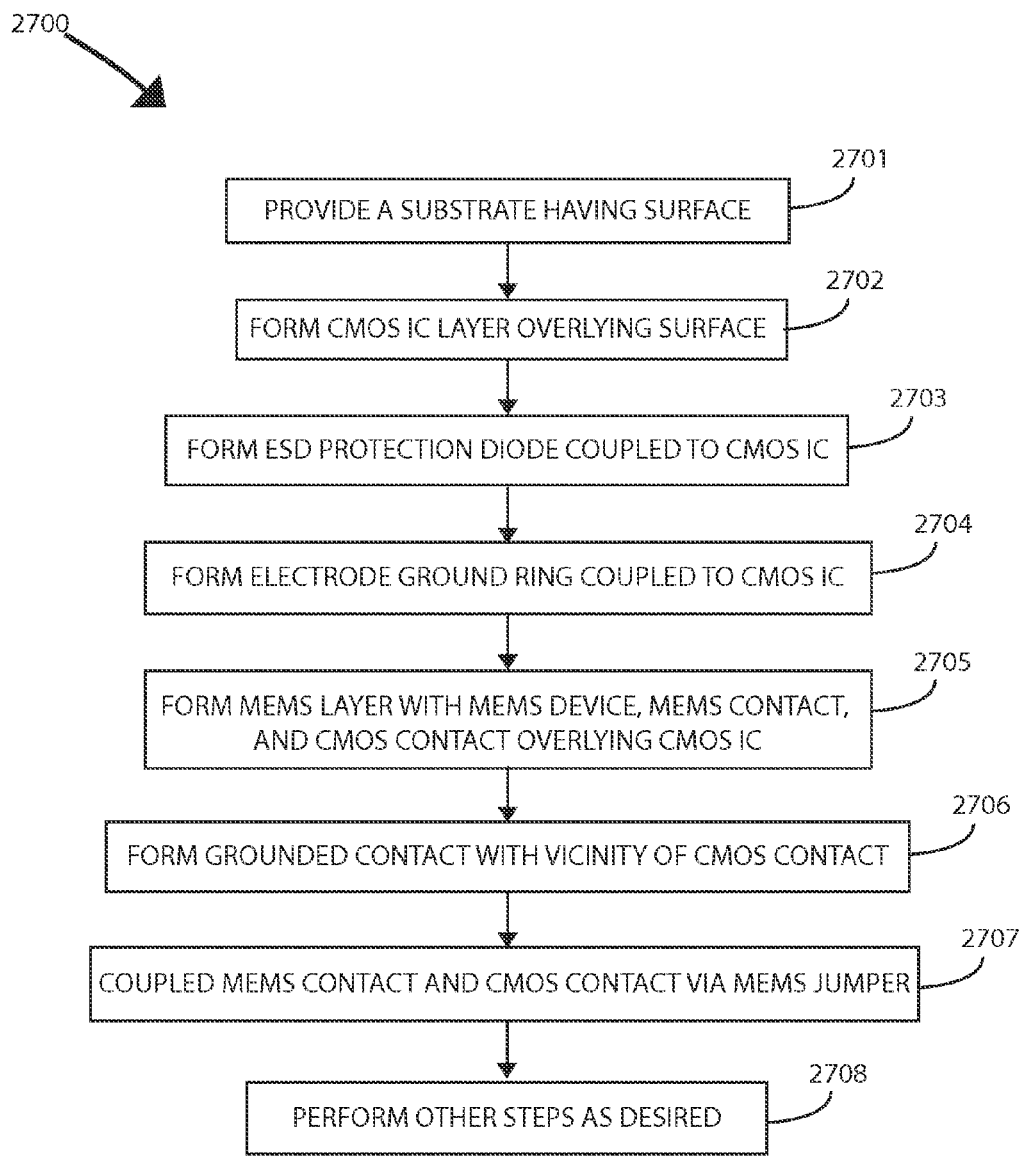
FIG. 27 illustrates a simplified flow diagram of a method for fabricating an integrated MEMS-CMOS device according to an embodiment of the present invention.

FIG. 27 illustrates a simplified flow diagram of a method for fabricating an integrated MEMS-CMOS device according to an embodiment of the present invention. In an embodiment, the present invention provides a method of providing plasma damage protection for an integrated MEMS-CMOS device. As shown, the method 2700 can include the following steps:

2701. Provide a substrate member having a surface region;
2702. Form a CMOS IC layer overlying the surface region, the CMOS IC layer having at least one CMOS device;
2703. Form at least one ESD protection diode coupled to the at least one CMOS device;
2704. Form an electrode ground ring structure overlying the at least one CMOS device, the electrode ground ring structure being coupled to ground and the CMOS device;
2705. Form a MEMS layer overlying the CMOS IC layer, the MEMS layer having a MEMS contact region, a CMOS contact region, and at least one MEMS device;
2706. Form a grounded contact region within a vicinity of the CMOS contact region;
2707. Couple the MEMS contact region and the CMOS contact region via a MEMS jumper structure, the MEMS jumper structure electrically coupling the at least one MEMS device and the at least one CMOS device; and
2708. Perform other steps as desired.

These steps are merely examples and should not unduly limit the scope of the claims herein. As shown, the above method provides a plasma damage protection method for integrated devices according to an embodiment of the present invention. One of ordinary skill in the art would recognize many other variations, modifications, and alternatives. For example, various steps outlined above may be added, removed, modified, rearranged, repeated, and/or overlapped, as contemplated within the scope of the invention.

Figure 28:
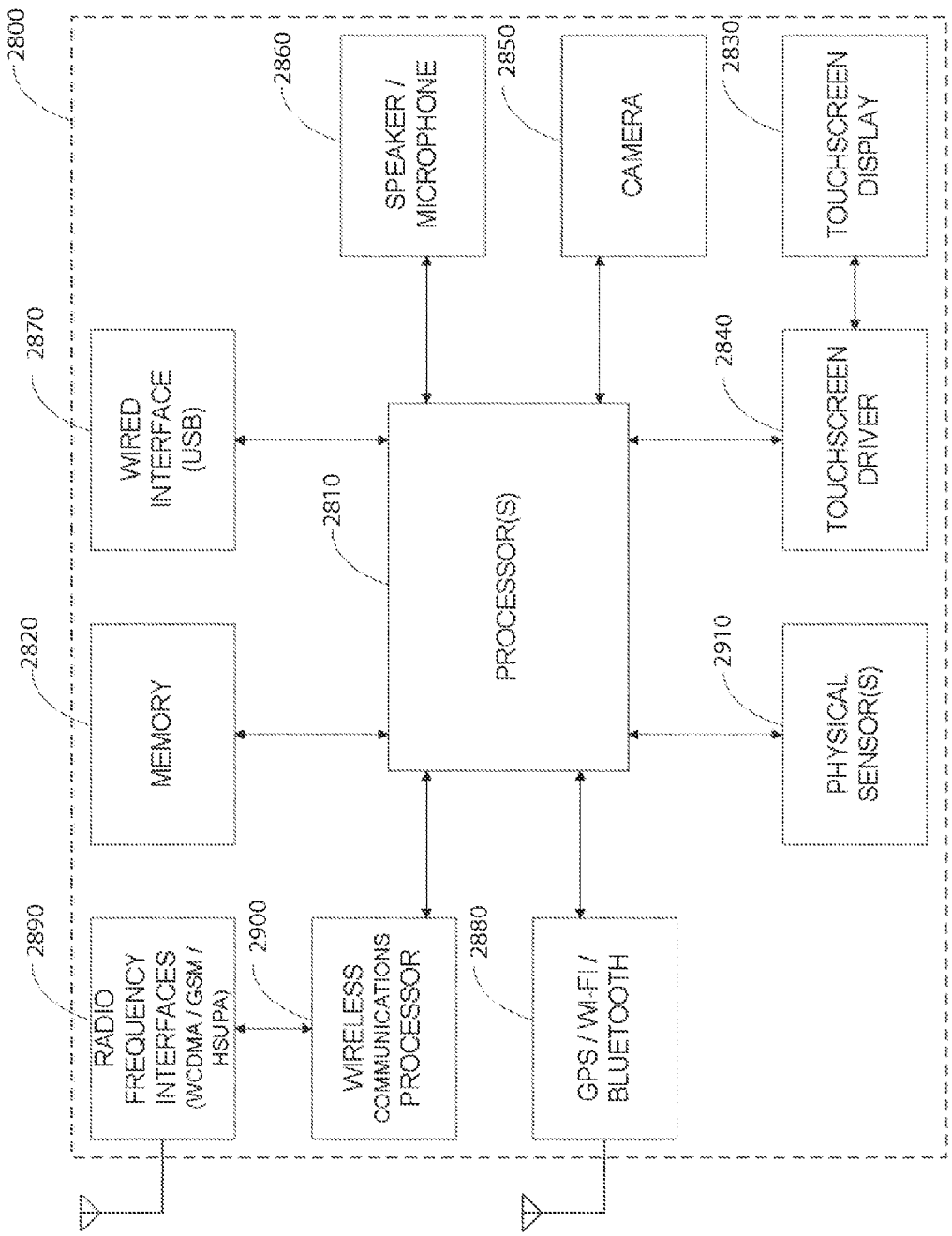
FIG. 28 illustrates a simplified functional block diagram of various embodiments of the present invention.

FIG. 28 illustrates a functional block diagram of various embodiments of the present invention. In FIG. 28, a computing device 2800 typically includes an applications processor 2810, memory 2820, a touch screen display 2830 and driver 2840, an image acquisition device 2850, audio input/output devices 2860, and the like. Additional communications from and to computing device are typically provided by via a wired interface 2870, a GPS/Wi-Fi/Bluetooth interface 2880, RF interfaces 2890 and driver 2900, and the like. Also included in various embodiments are physical sensors 2910.

In various embodiments, computing device 2800 may be a hand-held computing device (e.g. Apple iPad, Apple iTouch, Dell Mini slate, Lenovo Skylight/IdeaPad, Asus EEE series, Microsoft Courier, Notion Ink Adam), a portable telephone (e.g. Apple iPhone, Motorola Droid, Google Nexus One, HTC Incredible/EVO 4G, Palm Pre series, Nokia N900), a portable computer (e.g. netbook, laptop), a media player (e.g. Microsoft Zune, Apple iPod), a reading device (e.g. Amazon Kindle, Barnes and Noble Nook), or the like.

Typically, computing device 2800 may include one or more processors 2810. Such processors 2810 may also be termed application processors, and may include a processor core, a video/graphics core, and other cores. Processors 2810 may be a processor from Apple (A4), Intel (Atom), NVidia (Tegra 2), Marvell (Armada), Qualcomm (Snapdragon), Samsung, TI (OMAP), or the like. In various embodiments, the processor core may be an Intel processor, an ARM Holdings processor such as the Cortex-A, -M, -R or ARM series processors, or the like. Further, in various embodiments, the video/graphics core may be an Imagination Technologies processor PowerVR-SGX, -MBX, -VGX graphics, an Nvidia graphics processor (e.g. GeForce), or the like. Other processing capability may include audio processors, interface controllers, and the like. It is contemplated that other existing and/or later-developed processors may be used in various embodiments of the present invention.

In various embodiments, memory 2820 may include different types of memory (including memory controllers), such as flash memory (e.g. NOR, NAND), pseudo SRAM, DDR SDRAM, or the like. Memory 2820 may be fixed within computing device 600 or removable (e.g. SD, SDHC, MMC, MINI SD, MICRO SD, CF, SIM). The above are examples of computer readable tangible media that may be used to store embodiments of the present invention, such as computer-executable software code (e.g. firmware, application programs), application data, operating system data or the like. It is contemplated that other existing and/or later-developed memory and memory technology may be used in various embodiments of the present invention.

In various embodiments, touch screen display 2830 and driver 2840 may be based upon a variety of later-developed or current touch screen technology including resistive displays, capacitive displays, optical sensor displays, electromagnetic resonance, or the like. Additionally, touch screen display 2830 may include single touch or multiple-touch sensing capability. Any later-developed or conventional output display technology may be used for the output display, such as TFT-LCD, OLED, Plasma, trans-reflective (Pixel Qi), electronic ink (e.g. electrophoretic, electrowetting, interferometric modulating). In various embodiments, the resolution of such displays and the resolution of such touch sensors may be set based upon engineering or non-engineering factors (e.g. sales, marketing). In some embodiments of the present invention, a display output port, such as an HDMI-based port or DVI-based port may also be included.

In some embodiments of the present invention, image capture device 2850 may include a sensor, driver, lens and the like. The sensor may be based upon any later-developed or convention sensor technology, such as CMOS, CCD, or the like. In various embodiments of the present invention, image recognition software programs are provided to process the image data. For example, such software may provide functionality such as: facial recognition, head tracking, camera parameter control, or the like.

In various embodiments, audio input/output 2860 may include conventional microphone(s)/speakers. In some embodiments of the present invention, three-wire or four-wire audio connector ports are included to enable the user to use an external audio device such as external speakers, headphones or combination headphone/microphones. In various embodiments, voice processing and/or recognition software may be provided to applications processor 2810 to enable the user to operate computing device 2800 by stating voice commands. Additionally, a speech engine may be provided in various embodiments to enable computing device 2800 to provide audio status messages, audio response messages, or the like.

In various embodiments, wired interface 2870 may be used to provide data transfers between computing device 2800 and an external source, such as a computer, a remote server, a storage network, another computing device 2800, or the like. Such data may include application data, operating system data, firmware, or the like. Embodiments may include any later-developed or conventional physical interface/protocol, such as: USB 2.0, 3.0, micro USB, mini USB, Firewire, Apple iPod connector, Ethernet, POTS, or the like. Additionally, software that enables communications over such networks is typically provided.

In various embodiments, a wireless interface 2880 may also be provided to provide wireless data transfers between computing device 2800 and external sources, such as computers, storage networks, headphones, microphones, cameras, or the like. As illustrated in FIG. 28, wireless protocols may include Wi-Fi (e.g. IEEE 802.11a/b/g/n, WiMax), Bluetooth, IR and the like.

GPS receiving capability may also be included in various embodiments of the present invention, however is not required. As illustrated in FIG. 28, GPS functionality is included as part of wireless interface 2880 merely for sake of convenience, although in implementation, such functionality is currently performed by circuitry that is distinct from the Wi-Fi circuitry and distinct from the Bluetooth circuitry.

Additional wireless communications may be provided via RF interfaces 2890 and drivers 2900 in various embodiments. In various embodiments, RF interfaces 2890 may support any future-developed or conventional radio frequency communications protocol, such as CDMA-based protocols (e.g. WCDMA), GSM-based protocols, HSUPA-based protocols, or the like. In the embodiments illustrated, driver 2900 is illustrated as being distinct from applications processor 2810. However, in some embodiments, these functionality are provided upon a single IC package, for example the Marvel PXA330 processor, and the like. It is contemplated that some embodiments of computing device 2800 need not include the RF functionality provided by RF interface 2890 and driver 2900.

FIG. 28 also illustrates computing device 2800 to include physical sensors 2910. In various embodiments of the present invention, physical sensors 2910 can be single axis or multi-axis Micro-Electro-Mechanical Systems (MEMS) based devices being developed by M-cube, the assignee of the present patent application. Physical sensors 2910 can include accelerometers, gyroscopes, pressure sensors, magnetic field sensors, bio sensors, and the like. In other embodiments of the present invention, conventional physical sensors 2810 from Bosch, STMicroelectronics, Analog Devices, Kionix or the like may be used.

In various embodiments, any number of future developed or current operating systems may be supported, such as iPhone OS (e.g. iOS), WindowsMobile (e.g. 7), Google Android (e.g. 2.2), Symbian, or the like. In various embodiments of the present invention, the operating system may be a multi-threaded multi-tasking operating system. Accordingly, inputs and/or outputs from and to touch screen display 2830 and driver 2840 and inputs/or outputs to physical sensors 2910 may be processed in parallel processing threads. In other embodiments, such events or outputs may be processed serially, or the like. Inputs and outputs from other functional blocks may also be processed in parallel or serially, in other embodiments of the present invention, such as image acquisition device 2850 and physical sensors 2910.

FIG. 28 is representative of one computing or micro-processing device 2800 capable of embodying the present invention. In one embodiment, the DOC can be implanted on chip with sensors instead of using an external processor. The previously described methods of operation can be implemented with on-chip logic or through a micro-processor in the same device or in a separate chip within the hand-held device. It will be readily apparent to one of ordinary skill in the art that many other hardware and software configurations are suitable for use with the present invention. Embodiments of the present invention may include at least some but need not include all of the functional blocks illustrated in FIG. 28. For example, in various embodiments, computing device 2800 may lack image acquisition unit 2850, or RF interface 2890 and/or driver 2900, or GPS capability, or the like. Additional functions may also be added to various embodiments of computing device 2800, such as a physical keyboard, an additional image acquisition device, a trackball or trackpad, a joystick, or the like. Further, it should be understood that multiple functional blocks may be embodied into a single physical package or device, and various functional blocks may be divided and be performed among separate physical packages or devices.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating an integrated MEMS-CMOS device comprising: providing a substrate member having a surface region; forming a CMOS IC layer overlying the surface region, the CMOS IC layer having at least one CMOS device; forming a MEMS layer overlying the CMOS IC layer, the MEMS layer having a MEMS contact region, a CMOS contact region, and at least one MEMS device, wherein the at least one MEMS device is electrically coupled to the MEMS contact region that is electrically decoupled from the CMOS IC layer during formation of the MEMS layer, and at least one CMOS device is electrically coupled to the CMOS contact region, wherein the at least one MEMS device is electrically decoupled from the CMOS device during formation of the MEMS contact region, and the MEMS contact region is electrically decoupled from the CMOS contact region, wherein MEMS contact region and the CMOS contact region form a MEMS jumper contact region; and coupling the MEMS contact region and the CMOS contact region via a MEMS jumper structure being applied to the MEMS jumper contact region after the forming of the MEMS layer, the MEMS jumper structure electrically coupling the at least one MEMS device and the at least one CMOS device.

2. The method of claim 1 wherein forming the MEMS layer further comprises forming a grounded contact region within a vicinity of the CMOS contact region, the grounded contact region being separate from the MEMS device and being electrically coupled to ground and being part of the MEMS jumper contact region, the grounded contact region being configured as a low resistance path to reduce plasma damage during the formation of the MEMS layer.

3. The method of claim 2 wherein the MEMS contact region, CMOS contact region, and grounded contact regions are formed as electrodes or via structures.

4. The method of claim 1 further comprising forming at least one ESD protection diode coupled to the at least one CMOS device.

5. The method of claim 1 further comprising forming and electrode ground ring structure overlying the at least one CMOS device, the electrode ground ring structure being electrically coupled to ground and the at least one CMOS device.

6. The method of claim 5 wherein the electrode ground ring structure is configured to direct plasma induced charge from a MEMS etching process to ground.

7. The method of claim 1 wherein the at least one MEMS device comprises an inertial sensor, an accelerometer, a gyrometer, a magnetic field sensor, a pressure sensor, a humidity sensor, a temperature sensor, a chemical sensor, or a biosensor.

8. A method for fabricating an integrated MEMS-CMOS device comprising: providing a substrate member having a surface region; forming a CMOS IC layer overlying the surface region, the CMOS IC layer having at least one CMOS device; forming a MEMS layer overlying the CMOS IC layer, the MEMS layer having a MEMS contact region that is electrically decoupled from the CMOS IC layer, a CMOS contact region, and at least one MEMS device, wherein the at least one MEMS device is electrically coupled to the MEMS contact region and at least one CMOS device is electrically coupled to the CMOS contact region, wherein the at least one MEMS device being is electrically decoupled from the CMOS device during formation of the MEMS contact region, wherein the MEMS contact region is configured at the top of the MEMS layer; wherein the CMOS contact region is configured at the top of the MEMS layer; wherein MEMS contact region and the CMOS contact region form a MEMS jumper contact region; and coupling the MEMS contact region and the CMOS contact region via a MEMS jumper structure being applied to the MEMS jumper contact region after the forming of the at least one MEMS device, the MEMS jumper structure electrically coupling the at least one MEMS device and the at least one CMOS device.

9. The method of claim 8 wherein forming the MEMS layer further comprises forming a grounded contact region within a vicinity of the CMOS contact region and separate from the MEMS device, the grounded contact region being electrically coupled to ground and being part of the MEMS jumper contact region, the grounded contact region being provided at the top of the MEMS layer and being configured as a low resistance path to reduce plasma damage during the formation of the MEMS layer.

10. The method of claim 9 wherein the MEMS contact region, CMOS contact region, and grounded contact regions are formed as electrodes or via structures.

11. The method of claim 8 further comprising forming at least one ESD protection diode coupled to the at least one CMOS device.

12. The method of claim 8 further comprising forming and electrode ground ring structure overlying the at least one CMOS device, the electrode ground ring structure being coupled to ground and the at least one CMOS device.

13. The method of claim 12 wherein the electrode ground ring structure is configured to direct plasma induced charge from a MEMS etching process to ground.

14. The method of claim 8 wherein the at least one MEMS device comprises an inertial sensor, an accelerometer, a gyrometer, a magnetic field sensor, a pressure sensor, a humidity sensor, a temperature sensor, a chemical sensor, or a biosensor.

15. The method of claim 8 further comprising forming the MEMS contact region and the CMOS contact region in the MEMS layer before forming the at least one MEMS device.

16. The method of claim 8 wherein the at least one MEMS device is formed below the MEMS contact region and the CMOS contact region in the MEMS layer.

17. The method of claim 1 further comprising forming the MEMS contact region and the CMOS contact region in the MEMS layer before forming the at least one MEMS device.

18. The method of claim 1 wherein the at least one MEMS device is formed below the MEMS contact region and the CMOS contact region in the MEMS layer.

* * * * *